(12) United States Patent  
Homma et al.

(10) Patent No.: US 11,929,332 B2  
(45) Date of Patent: Mar. 12, 2024

(54) SEMICONDUCTOR DEVICE AND MANUFACTURING METHOD THEREOF

(71) Applicant: Kioxia Corporation, Tokyo (JP)

(72) Inventors: Soichi Homma, Yokkaichi (JP); Tatsuo Migita, Nagoya (JP); Masayuki Miura, Ota (JP); Takeori Maeda, Mie (JP); Kazuhiro Kato, Mie (JP); Susumu Yamamoto, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 175 days.

(21) Appl. No.: 17/189,718

(22) Filed: Mar. 2, 2021

(65) Prior Publication Data

US 2022/0013477 A1   Jan. 13, 2022

(30) Foreign Application Priority Data

Jul. 7, 2020 (JP) .................................. 2020-117274

(51) Int. Cl.
| | |
|---|---|
| *H01L 25/065* | (2023.01) |
| *H01L 23/00* | (2006.01) |
| *H01L 25/00* | (2006.01) |
| *H01L 25/18* | (2023.01) |

(52) U.S. Cl.
CPC ............ *H01L 23/562* (2013.01); *H01L 24/13* (2013.01); *H01L 25/0657* (2013.01); *H01L 25/18* (2013.01); *H01L 25/50* (2013.01); *H01L 2224/13026* (2013.01); *H01L 2225/06548* (2013.01); *H01L 2225/06562* (2013.01); *H01L 2225/06586* (2013.01);

(Continued)

(58) Field of Classification Search
CPC ... H01L 23/562; H01L 24/13; H01L 25/0657; H01L 25/18; H01L 25/50; H01L 2224/13026; H01L 2225/06548; H01L 2225/06562; H01L 2225/06586; H01L 2924/1431; H01L 2924/14511; H01L 2924/3511; H10B 80/00  
See application file for complete search history.

(56) References Cited

U.S. PATENT DOCUMENTS 6,960,878 B2   11/2005 Sakano et al.  
2019/0280205 A1*  9/2019 Yamauchi ............ H10K 71/135  
(Continued)

FOREIGN PATENT DOCUMENTS

| JP | 3428597 B2 | 7/2003 |
| JP | 2011-243724 A | 12/2011 |
| JP | 2012-15446 A | 1/2012 |

(Continued)

*Primary Examiner* — Timor Karimy  
(74) *Attorney, Agent, or Firm* — Oblon, McClelland, Maier & Neustadt, L.L.P.

(57) ABSTRACT

A semiconductor device includes a semiconductor chip having a first face and a second face on an opposite side to the first face, and including semiconductor elements arranged on the first face. Columnar electrodes are arranged above the first face, and electrically connected to any of the semiconductor elements. A first member is located around the columnar electrodes above the first face. An insulant covers the columnar electrodes and the first member. The first member is harder than the columnar electrodes and the insulant. The first member and the columnar electrodes are exposed from a surface of the insulant.

20 Claims, 37 Drawing Sheets

(52) U.S. Cl.
CPC ............... *H01L 2924/1431* (2013.01); *H01L 2924/14511* (2013.01); *H01L 2924/3511* (2013.01)

(56) References Cited

U.S. PATENT DOCUMENTS

2020/0058688 A1* 2/2020 Kwon ............... H01L 27/14687
2021/0296324 A1* 9/2021 Lim ................. H01L 27/11568

FOREIGN PATENT DOCUMENTS

JP          2012-59730 A     3/2012
KR   10-2020-0034338     *  3/2020

\* cited by examiner

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2020-117274, filed on Jul. 7, 2020, the entire contents of which are incorporated herein by reference.

FIELD

The embodiments of the present invention relate to a semiconductor device and manufacturing method thereof.

BACKGROUND

A technology of sealing a plurality of semiconductor chips and a controller chip with a resin as one semiconductor package (CSP (Chip Scale Package)) is developed.

However, there is a problem that the thickness of the semiconductor package varies when the resin is polished to adjust the thickness of the semiconductor package. If the semiconductor package is too thinned, the semiconductor package warps. Furthermore, polishing the resin while measuring the thickness of the resin lowers the throughput.

DETAILED DESCRIPTION

Figure 1:
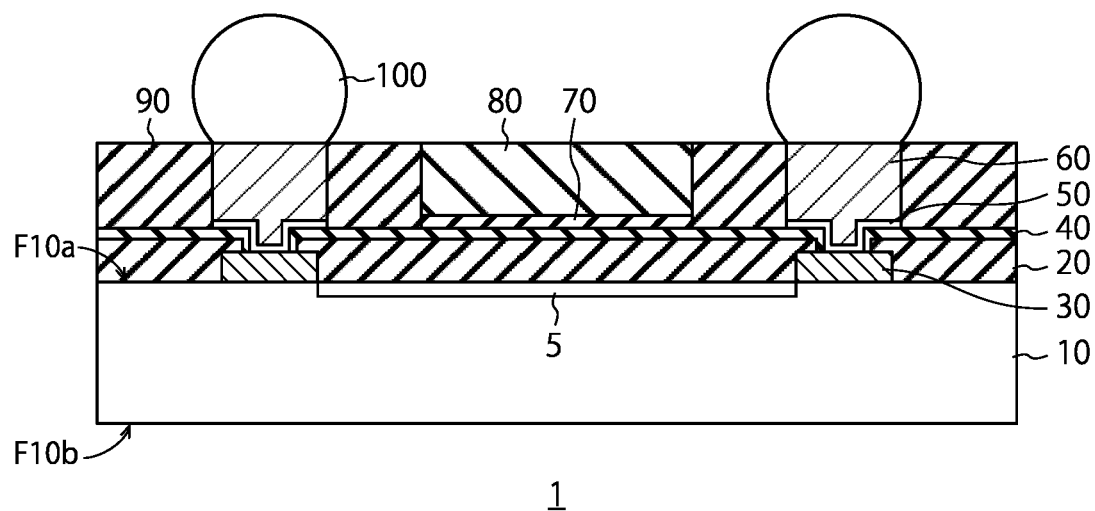
FIG. 1 is a sectional view illustrating an example of the configuration of a semiconductor device according to a first embodiment.

Embodiments will now be explained with reference to the accompanying drawings. The present invention is not limited to the embodiments. In the embodiments, "an upper direction" or "a lower direction" refers to a relative direction when a direction perpendicular to a surface of a semiconductor substrate on which semiconductor elements or semiconductor chips are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor device according to the present embodiment comprises a semiconductor chip having a first face and a second face on an opposite side to the first face, and including semiconductor elements arranged on the first face. Columnar electrodes are arranged above the first face, and electrically connected to any of the semiconductor elements. A first member is located around the columnar electrodes above the first face. An insulant covers the columnar electrodes and the first member. The first member is harder than the columnar electrodes and the insulant. The first member and the columnar electrodes are exposed from a surface of the insulant.

First Embodiment

FIG. 1 is a sectional view illustrating an example of the configuration of a semiconductor device 1 according to a first embodiment. The semiconductor device 1 includes a semiconductor chip 10, a first insulating film 20, electrode pads 30, a second insulating film 40, a barrier metal 50, columnar electrodes 60, a resin layer 70, a dummy member 80 being a first member, a third insulating film 90 being an insulant, and metallic bumps 100. The semiconductor device 1 can be, for example, a semiconductor package such as a NAND flash memory or an LSI (Large Scale Integration).

The semiconductor chip 10 has a first face F10a and a second face F10b on the opposite side to the first face F10a. Semiconductor elements 5 such as a transistor and a capacitor are formed on the first face F10a of the semiconductor chip 10. The semiconductor chip 10 can be, for example, a memory chip of a NAND flash memory or a semiconductor chip having any LSI mounted thereon.

The first insulating film 20 is located on the first face F10a of the semiconductor chip 10, and covers and protects the semiconductor elements. For example, an inorganic insulating material such as a silicon dioxide film or a silicon nitride film is used as the first insulating film 20.

The electrode pads 30 are located on the first face F10a of the semiconductor chip 10 and are electrically connected any of the semiconductor elements. For example, a low-resistance metal such as a simple substance of Al, Cu, Au, Ni, Pd, or W, a composite membrane including two or more thereof, or an alloy including two or more thereof is used as the electrode pads 30. The first insulating film 20 is partially removed so as to expose portions of the electrode pads 30.

The second insulating film 40 is located on the first insulating film 20 and is interposed between the first insulating film 20 and the third insulating film 90. For example, an organic insulating material such as a phenol-based resin, a polyimide-based resin, a polyamide-based resin, an acrylic-based resin, an epoxy-based resin, a PBO (p-phenylene benzobisoxazole)-based resin, a silicon-based resin, or a benzocyclobutene-based resin, or a mixed material or a composite material thereof is used as the second insulating film 40.

The barrier metal 50 being a metallic film is located between the associated columnar electrodes 60 and the associated electrode pads 30 or the second insulating film 40. The barrier metal 50 is used as a plating electrode at the time of forming the columnar electrodes 60. For example, a simple substance of Ti, TiN, Cr, CrN, Cu, Ni, Au, Pd, or W, a composite membrane including two or more thereof, or an alloy including two or more thereof is used as the barrier metal 50.

The columnar electrodes 60 are located on associated portions of the barrier metal 50 above the first face F10a of the semiconductor chip 10, respectively. The columnar electrodes 60 extend in a substantially perpendicular direction to the first face F10a from the associated portions of the barrier metal 50. Lower ends of the columnar electrodes 60 are electrically connected to any of the semiconductor elements of the semiconductor chip 10 via the associated portions of the barrier metal 50 and the associated electrode pads 30, respectively. Upper ends of the columnar electrodes 60 are connected to the metallic bumps 100, respectively. For example, a conductive metal such as a simple substance of Cu, Ni, W, Au, Ag, Pd, Sn, Bi, Zn, Cr, or Al, a composite membrane including two or more thereof, or an alloy including two or more thereof is used as the columnar electrodes 60.

Since the columnar electrodes 60 are formed by a plating method or a wiring method, the columnar electrodes 60 are formed above the barrier metal 50 which is exposed in a process of forming the columnar electrodes 60. The columnar electrodes 60 may be formed directly on the electrode pads 30 in the case of using the wiring method.

The resin layer 70 is located between the dummy member 80 and the second insulating film 40 and causes the dummy member 80 to adhere to the second insulating film 40 on the first face F10a. For example, a DAF (Die Attach Film) or a DAP (Die Attach Paste) including a phenol-based resin, a polyimide-based resin, a polyamide-based resin, an acrylic-based resin, an epoxy-based resin, a PBO (p-phenylene benzobisoxazole)-based resin, a silicon-based resin, or a benzocyclobutene-based resin, or a mixed material or a composite material thereof is used as the resin layer 70.

The dummy member 80 being the first member is arranged around the columnar electrodes 60 above the first face F10a. The dummy member 80 and the columnar electrodes 60 are formed at substantially same height levels from the first face F10a, and upper surfaces of the dummy member 80 and the columnar electrodes 60 are exposed from the surface of the third insulating film 90 to be substantially flush. The dummy member 80 is formed of a harder material than both the columnar electrodes 60 and the third insulating film 90 to function as a polishing stopper in a process of polishing the third insulating film 90. For example, an epoxy-based resin, a phenol-based resin, a polyimide-based resin, a polyamide-based resin, an acrylic-based resin, a PBO-based resin, a silicon-based resin, or a benzocyclobutene-based resin, or a mixed material or a composite material thereof is used as the third insulating film 90. For example, silicon, glass, alumina, SiC, AlN, ceramics, or a metal is used as the dummy member 80.

The third insulating film 90 covers and fills surrounding portions of the columnar electrodes 60 and the dummy member 80 above the first face F10a. The surface of the third insulating film 90 is substantially flush with the surfaces of the columnar electrodes 60 and the dummy member 80 and exposes the surfaces of the columnar electrodes 60 and the dummy member 80.

The metallic bumps 100 are located on the columnar electrodes 60, respectively. For example, a conductive metal such as solder is used as the metallic bumps 100.

As described above, in the semiconductor device 1 according to the present embodiment, the dummy member 80 is provided around the columnar electrodes 60 and is embedded in the third insulating film 90 along with the columnar electrodes 60. The dummy member 80 is formed of a harder material than the columnar electrodes 60 and the third insulating film 90 and functions as a stopper in the polishing process of the third insulating film 90. This enables the polishing processing to be stopped when the dummy member 80 is exposed from the third insulating film 90. As a result, the thickness of the third insulating film 90 does not vary and the thickness of the package of the semiconductor device 1 becomes stable.

Furthermore, the thickness of the third insulating film 90 can be controlled with the thickness of the dummy member 80. Therefore, the thickness of the third insulating film 90 does not need to be measured in the middle of polishing and the throughput can be increased.

Since the dummy member 80 is formed of a harder material than the columnar electrodes 60 and the third insulating film 90, the semiconductor device 1 is reinforced and is less likely to warp. This leads to an increase in the reliability of the semiconductor device 1. The warp can also be adjusted by changing the volume of the dummy member 80 in the semiconductor device 1, which can further increase the reliability.

A manufacturing method of the semiconductor device 1 according to the present embodiment is explained next.

FIGS. 2 to 12 are sectional views illustrating an example of the manufacturing method of the semiconductor device 1 according to the first embodiment. While a semiconductor chip is shown in the drawings, this semiconductor chip is a part in a wafer state before being diced.

Figure 2:
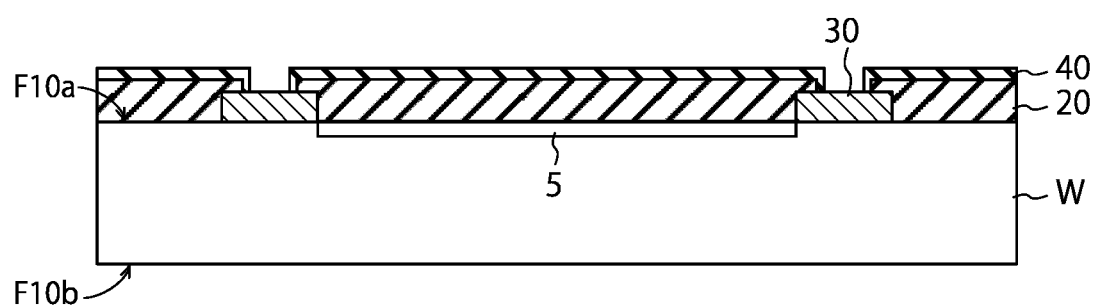
FIGS. 2 to 12 are sectional views illustrating an example of the manufacturing method of the semiconductor device according to the first embodiment.

First, the semiconductor elements (not illustrated) are formed on the first face F10a of a semiconductor wafer W. The semiconductor wafer W can be, for example, a semiconductor substrate such as a silicon substrate. Next, the electrode pads 30 that are electrically connected to the semiconductor elements are formed on the first face F10a. For example, a simple substance of Al, Cu, Au, Ni, Pd, or W, a composite membrane including two or more thereof, or an alloy including two or more thereof is used as the electrode pads 30. Next, the first insulating film 20 is formed on the first face F10a so as to cover the semiconductor elements. The first insulating film 20 is processed by a lithography technique and an etching technique to expose portions of the electrode pads 30. For example, an inorganic insulating material such as a silicon dioxide film or a silicon nitride film is used as the first insulating film 20. Next, the second insulating film 40 is formed on the first insulating film 20. The second insulating film 40 is also processed to expose the portions of the electrode pads 30. For example, an organic insulating material such as a phenol-based resin, a polyimide-based resin, a polyamide-based resin, an acrylic-based resin, an epoxy-based resin, a PBO (p-phenylene benzobisoxazole)-based resin, a silicon-based resin, or a benzocyclobutene-based resin, or a mixed material or a composite material thereof is used as the second insulating film 40. A structure illustrated in FIG. 2 is thereby obtained.

Figure 3:
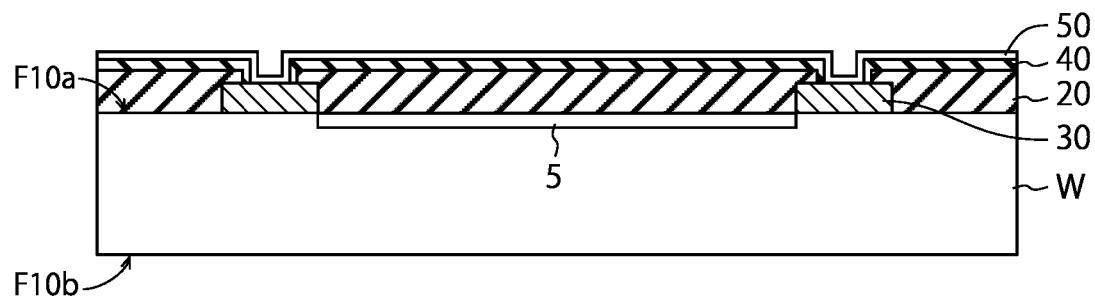

Next, the barrier metal 50 is formed on the electrode pads 30 and the second insulating film 40 using a sputtering method, a vapor deposition method, or an electroless plating method as illustrated in FIG. 3. For example, a simple substance of Ti, TiN, Cr, CrN, Cu, Ni, Au, Pd, or W, a composite membrane including two or more thereof, or an alloy including two or more thereof is used as the barrier metal 50. For example, a stacked film including a Ti film with a thickness of 0.1 micrometer (μm) and a Cu film with a thickness of 0.3 μm, formed using the sputtering method, is used as the barrier metal 50.

Figure 4:
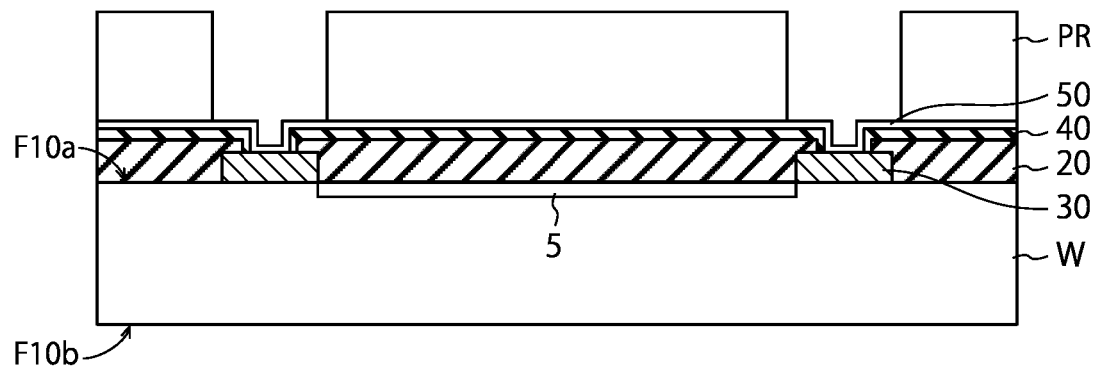

Next, a photoresist PR is applied onto the barrier metal 50 as illustrated in FIG. 4. The photoresist PR is processed in a pattern of the columnar electrodes 60 using the lithography technique. For example, the thickness of the photoresist PR is about 40 μm and an opening of an about 100-μm square is formed on each of the electrode pads 30. The pitch between adjacent ones of the openings is about 300 μm. $O_2$ asher processing may be performed to remove residues on bottom portions of the openings. This enables portions of the barrier metal 50 at formation locations of the columnar electrodes 60 to be reliably exposed.

Figure 5:
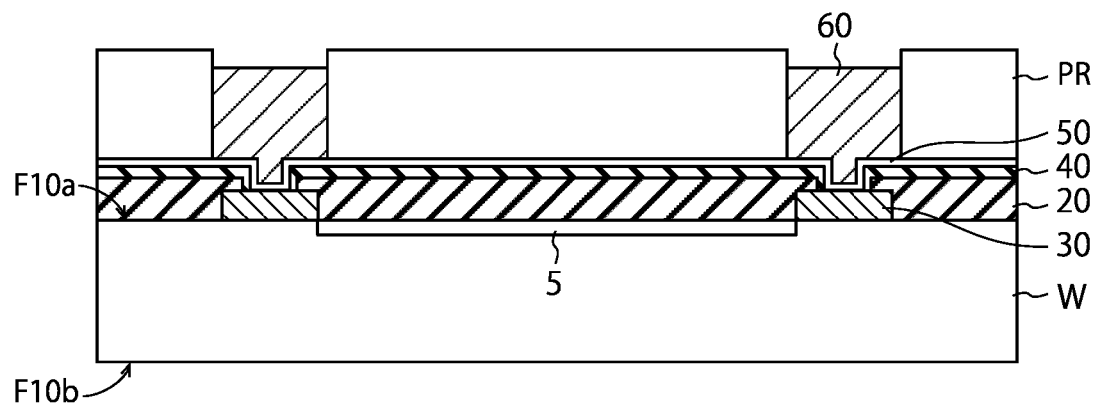

Next, a simple substance of Cu, Ni, W, Au, Ag, Pd, Sn, Bi, Zn, Cr, or Al, a composite membrane including two or more thereof, or an alloy including two or more thereof is deposited on the exposed portions of the barrier metal 50 by an electroplating method or the like. Accordingly, formation regions of the columnar electrodes 60 are selectively plated with the metal and the columnar electrodes 60 are formed as illustrated in FIG. 5. For example, the columnar electrodes 60 are formed by plating with Cu to have a thickness of about 35 μm.

Figure 6:
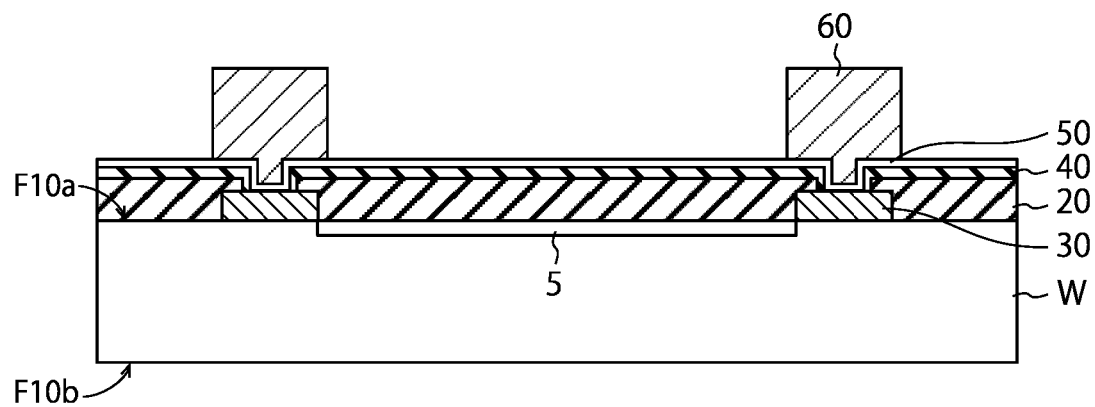

Next, the photoresist PR is separated as illustrated in FIG. 6. After the separation, $O_2$ asher processing may be performed to remove residues.

Figure 7:
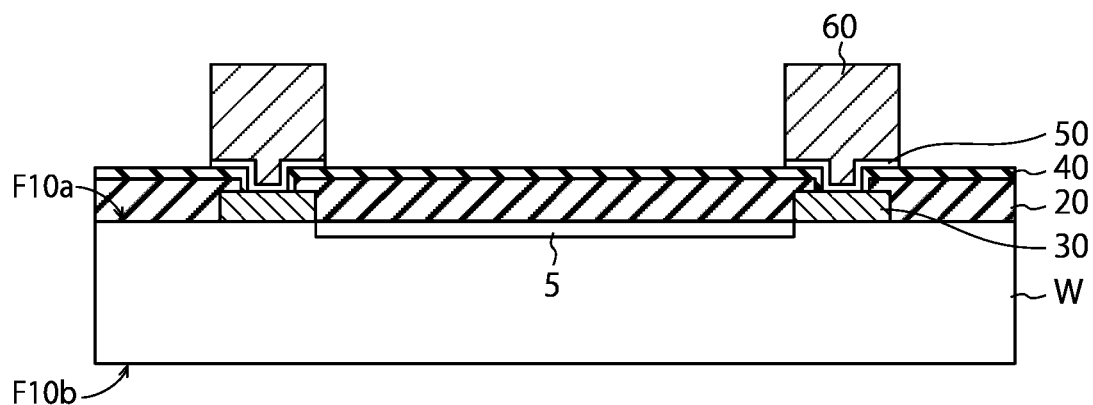

Next, the barrier metal 50 is etched using the columnar electrodes 60 as a mask as illustrated in FIG. 7. For example, in a case where the barrier metal 50 is Cu, it is adequate to perform wet etching with a mixed solution including a citric acid and a hydrogen peroxide. In a case where the barrier metal 50 is Ti, it is adequate to perform etching with a hydrofluoric acid, a hydrogen peroxide solution, or the like.

Figure 8:
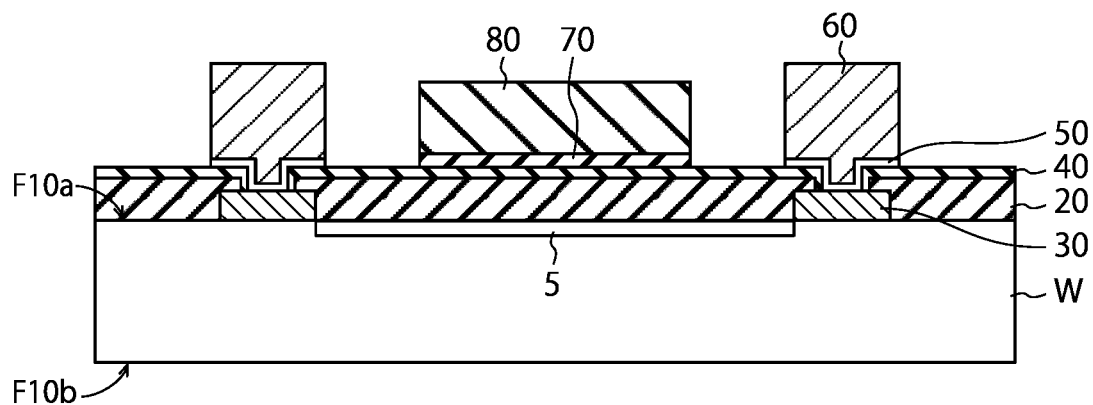

Next, the dummy members 80 in the shape of a chip are sticked onto the first face F10a with the resin layer 70 as illustrated in FIG. 8. For example, a simple substance of a DAF (Die Attach Film) or a DAP (Die Attach Paste) including a phenol-based resin, a polyimide-based resin, a polyamide-based resin, an acrylic-based resin, an epoxy-based resin, a PBO (p-phenylene benzobisoxazole)-based resin, a silicon-based resin, or a benzocyclobutene-based resin, or a mixed material including two or more thereof, or a stacked material including two or more thereof is used as the resin layer 70. The dummy members 80 are a harder material than the columnar electrodes 60 and the third insulating film 90 illustrated in FIG. 9. For example, a simple substance of silicon, glass, alumina, SiC, AlN, ceramics, or a metal, a mixed material including two or more thereof, or a stacked material including two or more thereof is used as the dummy members 80. The Vickers hardness of the dummy members 80 is desirably not less than 0.85 GPa and not more than 30 GPa. If less than 0.85 GPa, the Vickers hardness is close to those of the third insulating film 90 and the columnar electrodes 60 and it is difficult to stop the polishing. If the Vickers hardness is conversely more than 30 GPa, the material is expensive and special, and is hard to use. More desirably, the Vickers hardness is not less than 5 GPa and not more than 25 GPa. The dummy members 80 are designed in advance to have a predetermined height. The upper surfaces of the dummy members 80 are positioned at a lower location than the upper surfaces of the columnar electrodes 60. This enables the dummy members 80 to stop polishing after the columnar electrodes 60 are exposed at the time of polishing of the third insulating film 90. For example, when the thickness of the columnar electrodes 60 is about 35 μm, the thickness of the resin layer 70 is set to about 5 μm and the thickness of the dummy members 80 is set to about 25 μm to obtain a total thickness of about 30 μm. In a case of using a metal as the dummy members 80, the dummy members 80 may be formed by the plating method. For example, after the columnar electrodes 60 are formed, a different metal from the columnar electrodes 60 may be formed as the dummy members 80 using the plating method. In this case, the resin layer 70 for sticking the dummy members 80 is not necessarily used.

Figure 9:
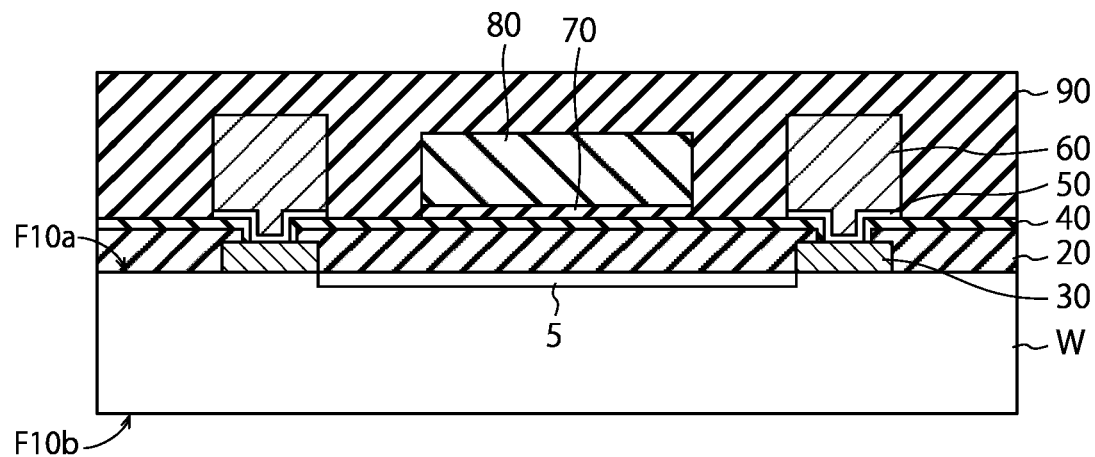

Next, the third insulating film 90 is formed on the first face F10a using a molding method or the like as illustrated in FIG. 9. The formation method of the third insulating film 90 may be a method of applying a liquid resin or may alternatively be a sheet molding method using a sheet film. An epoxy-based resin, a phenol-based resin, a polyimide-based resin, a polyamide-based resin, an acrylic-based resin, a PBO-based resin, a silicon-based resin, or a benzocyclobutene-based resin, or a mixed material or a composite material thereof is used as the third insulating film 90. Examples of the epoxy resin are not particularly limited and are bisphenol-based epoxy resins such as a bisphenol A type, a bisphenol F type, a bisphenol AD type, and a bisphenol S type, novolak-based epoxy resins such as a phenol novolak type and a cresol novolak type, aromatic epoxy resins such as a resorcinol-based epoxy resin and trisphenol methane triglycidyl ether, a naphthalene-based epoxy resin, a fluoren-based epoxy resin, a dicyclopentadiene-based epoxy resin, a polyether-modified epoxy resin, a benzophenone-based epoxy resin, an aniline-based epoxy resin, an NBR-modified epoxy resin, a CTBN-modified epoxy resin, and hydrogenated substances thereof. Among these, the naphthalene-based epoxy resin and the dicyclopentadiene-based epoxy resin are preferable because of a high adhesiveness with Si. The benzophenone-based epoxy resin is also preferable because it is likely to rapidly harden. These epoxy resins can be used alone, or two or more types thereof may be used in combination. The third insulating film 90 may contain a filler such as silica. The third insulating film 90 is formed so as to embed the columnar electrodes 60 and the dummy members 80. The third insulating film 90 is hardened by heating with an oven, or by curing with ultraviolet rays or the like in the case of a UV curable resin.

Figure 10:
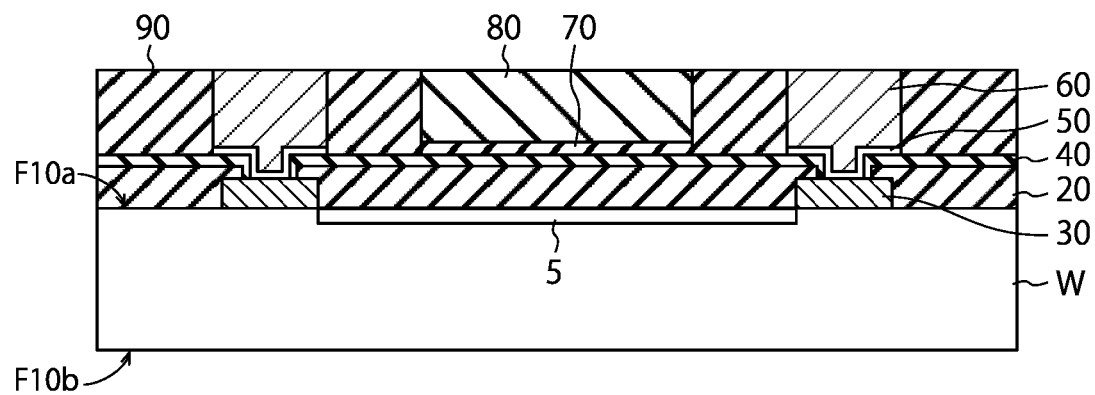

Next, the third insulating film 90 and the columnar electrodes 60 are polished using a mechanical polishing method, a CMP (Chemical Mechanical Polishing) method, or the like, to expose the dummy members 80 as illustrated in FIG. 10. Since the dummy members 80 are formed of a harder material than the hardened third insulating film 90 and the columnar electrodes 60, the polishing of the third insulating film 90 and the columnar electrodes 60 can be stopped when the dummy members 80 are exposed. For example, in a case where the thickness of the dummy members 80 and the underlying resin layer 70 is about 30 μm, the thickness of the third insulating film 90 can be equalized to be about 30 μm. Since the upper surfaces of the dummy members 80 are lower than the upper surfaces of the columnar electrodes 60, the dummy members 80 can stop the polishing after the columnar electrodes 60 are exposed.

Figure 11:
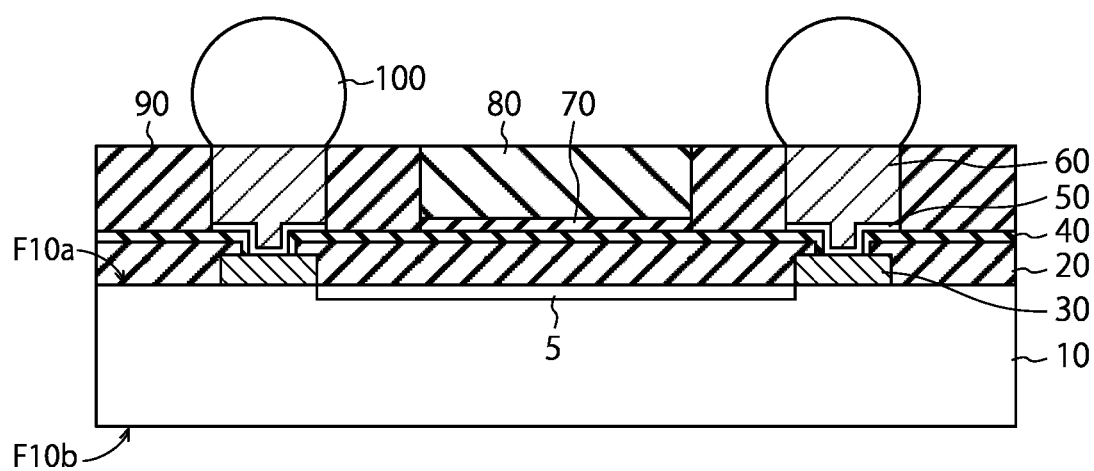

Next, flux is applied onto the columnar electrodes 60 to form the metallic bumps 100 as illustrated in FIG. 11. A metal such as solder including Sn as a primary component is used as the metallic bumps 100. For example, a simple substance of Sn, Ag, Cu, Au, Pd, Bi, or Zn, or a composite film or an alloy of two or more thereof is used. Subsequently, the metallic bumps 100 are reflowed to connect the metallic bumps 100 to the columnar electrodes 60.

Figure 12:
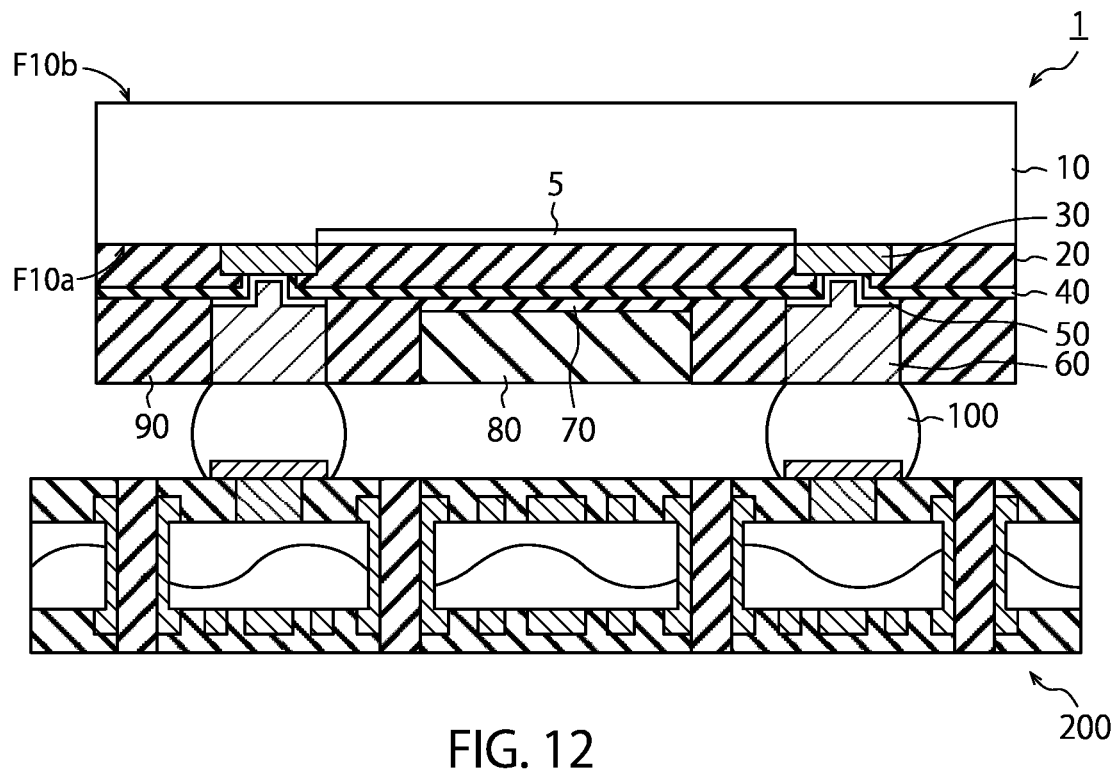

Next, the semiconductor wafer W is diced using a blade dicing method or a laser dicing method to singulate the semiconductor chips 10. The semiconductor device 1 illustrated in FIG. 11 is thereby completed. Thereafter, the semiconductor device 1 is mounted on a wiring board 200 and the metallic bumps 100 are respectively connected to electrode pads of the wiring board 200 as illustrated in FIG. 12. Another semiconductor device may be mounted on the wiring board 200 for modularization. The semiconductor wafer W may be mounted on the wiring board 200 and thereafter the semiconductor wafer W may be diced along with the wiring board 200. The metallic bumps 100 may be formed on the wiring board 200. In this case, exposed surfaces of the columnar electrodes 60 and the metallic bumps 100 formed on the wiring board 200 are connected to each other.

As described above, according to the present embodiment, the dummy members 80 are provided on the first face F10a along with the columnar electrodes 60. The dummy members 80 are formed of a harder material than the columnar electrodes 60 and the third insulating film 90 and function as a stopper in the polishing process of the third insulating film 90. Accordingly, the thickness of the third insulating film 90 does not vary and the thickness of the package of the semiconductor device 1 becomes stable.

Further, the thickness of the third insulating film 90 can be controlled with the thickness of the dummy members 80. Therefore, the thickness of the third insulating film 90 does not need to be measured in the middle of the polishing and the throughput can be increased.

Since the dummy members 80 are formed of a harder material than the columnar electrodes 60 and the third insulating film 90, the semiconductor device 1 is reinforced and is less likely to warp. This leads to an increase in the reliability of the semiconductor device 1.

For example, a thermal cycle test was conducted on the semiconductor device 1 according to the present embodiment in order to check the reliability. The thermal cycle test was conducted at −55° C. (30 minutes (min)), 25° C. (5 min), and 125° C. (30 min) as one cycle. As a result, there was no problem in the semiconductor device 1 even after 3000 cycles.

Second Embodiment

Figure 13:
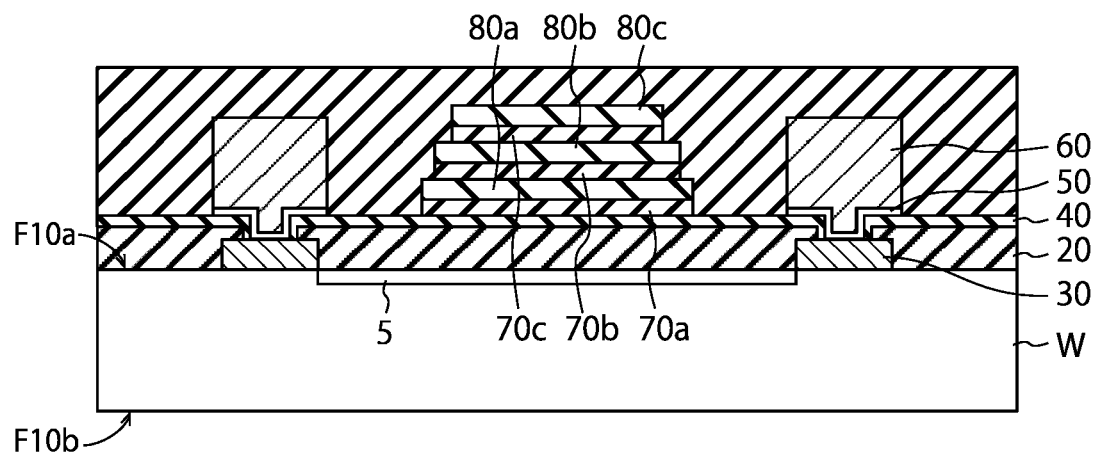
FIGS. 13 and 14 are sectional views illustrating an example of the manufacturing method and configuration of the semiconductor device according to a second embodiment.
Figure 14:
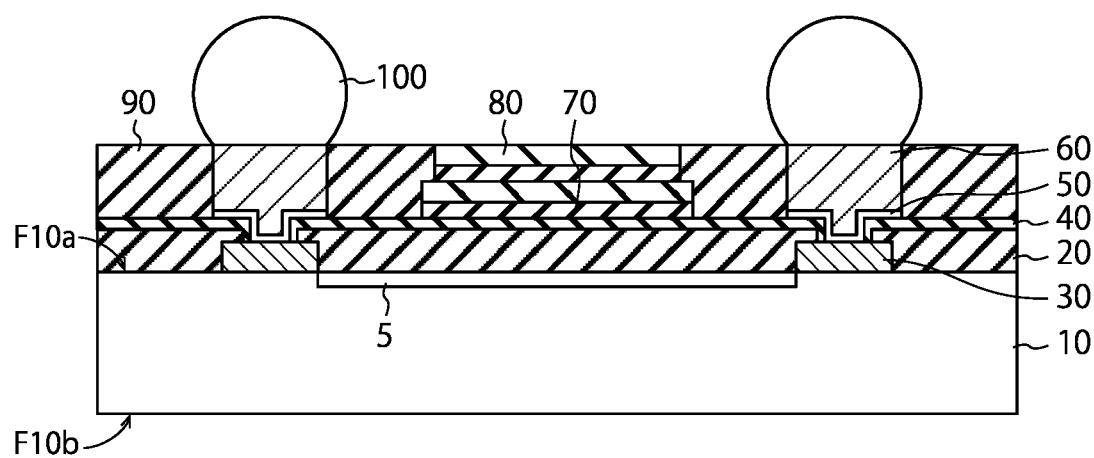

FIGS. 13 and 14 are sectional views illustrating an example of the manufacturing method and configuration of the semiconductor device 1 according to a second embodiment. FIG. 13 illustrates a configuration in the middle of manufacturing of the semiconductor device 1 and illustrates a state corresponding to FIG. 9 in the first embodiment. FIG. 14 illustrates a completed configuration of the semiconductor device 1.

In the second embodiment, the dummy member 80 is divided into members 80a to 80c being a plurality of second members having areas different from each other as viewed from above the first face F10a, and is a stacked body configured by stacking the members 80a to 80c. The polishing area of the dummy member 80 changes with the areas of the members 80a to 80c different from each other. Since the polishing resistance changes according to changes in the polishing area of the dummy member 80, a polishing apparatus (not illustrated) can determine one of the members 80a to 80c that is being polished. The polishing apparatus stops the polishing processing when the polishing area (or the polishing resistance) of the dummy member has a predetermined value. Setting in advance the thicknesses of the members 80a to 80c and resin layers 70a to 70c corresponding to the polishing areas (or the polishing resistances) of the dummy member 80, a remaining film thickness of the dummy member 80 (a remaining film thickness of the third insulating film 90) in the polishing can be controlled.

The manufacturing method according to the second embodiment is explained in more detail.

After the processes illustrated in FIGS. 2 to 7 are performed, the members 80a are sticked onto the second insulating film 40 with the resin layer 70a, the members 80b are respectively sticked onto the members 80a with the resin layer 70b, and the members 80c are respectively sticked onto the members 80b with the resin layer 70c. For example, the thickness of each of the members 80a to 80c is set to about 10 μm and the thickness of each of the resin layers 70a to 70c is set to about 5 μm. In this case, the height of the dummy members 80 is about 45 μm. As viewed from above the first face F10a, the area of the members 80a is largest among the members 80a to 80c and the areas of the members 80b and 80c decrease in this order. Accordingly, the side surfaces of the members 80a to 80c are configured to have steps in a manner of stairs as illustrated in FIG. 13. Materials of the members 80a to 80c can be same as that of the dummy members 80 in the first embodiment. Materials of the resin layers 70a to 70c can be same as that of the resin layer 70 in the first embodiment.

Next, the third insulating film 90 is formed so as to embed the members 80a to 80c and the columnar electrodes 60 in the manner as explained with reference to FIG. 9. The structure illustrated in FIG. 13 is thereby obtained.

Next, the third insulating film 90 and the columnar electrodes 60 are polished to expose the dummy members 80. At this time, the dummy members 80 are polished sequentially from the members 80c. Therefore, the polishing area of the dummy members 80 is initially small and gradually increases. Since the polishing resistance changes with changes in the polishing area of the dummy members 80, the polishing apparatus can detect which one of the members 80a to 80c is exposed. This enables the thickness of the third insulating film 90 to be controlled. For example, when the polishing is to be stopped at a time when the members 80b are exposed, the polishing apparatus stops the polishing at a time when the members 80b are exposed after the members 80c and the resin layer 70c are polished. Accordingly, the thickness of the third insulating film 90 can be controlled to be substantially equal to a total thickness of the members 80a and 80b and the resin layers 70a and 70b (for example, 30 μm in this example) as illustrated in FIG. 14.

Next, flux is applied onto the columnar electrodes 60 to form the metallic bumps 100. Next, the semiconductor wafer W is diced to singulate the semiconductor chips 10. The semiconductor device 1 illustrated in FIG. 14 is thereby completed.

The polishing may be stopped at a time when the members 80a are exposed. Each of the dummy members 80 may be a stacked body including members of two layers, or may be a stacked body including members of four or more layers. The thicknesses of the members 80a to 80c may be different from each other as long as they are known in advance.

According to the second embodiment, the dummy member 80 is a stacked body including the members 80a to 80c that have areas different from each other in a planar view. The thicknesses of the members 80a to 80c and the resin layers 70a to 70c are set in advance. This facilitates the control of the film thickness of the third insulating film 90. Other configurations of the second embodiment can be identical to those of the first embodiment.

Therefore, the second embodiment can also achieve effects identical to those of the first embodiment.

Third Embodiment

Figure 15:
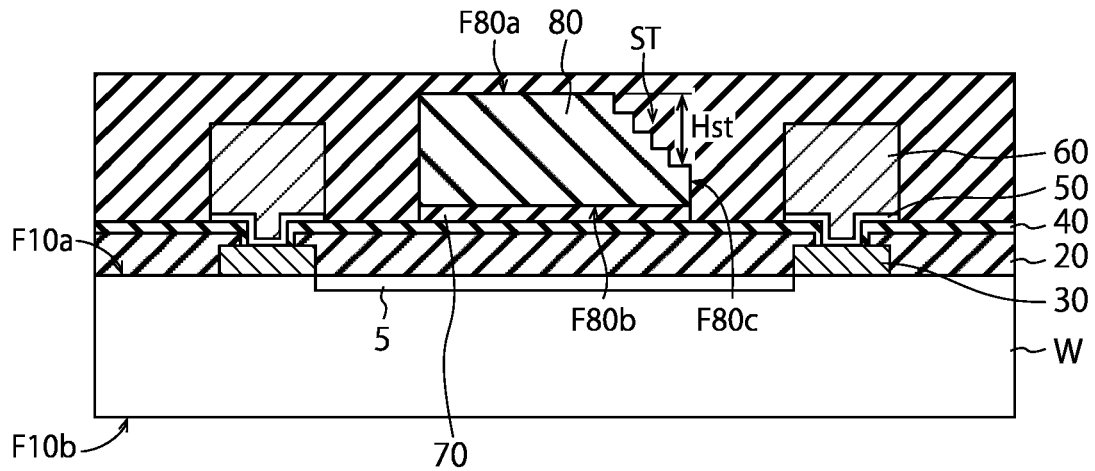
FIGS. 15 and 16 are sectional views illustrating an example of the manufacturing method and configuration of the semiconductor device according to a third embodiment.
Figure 16:
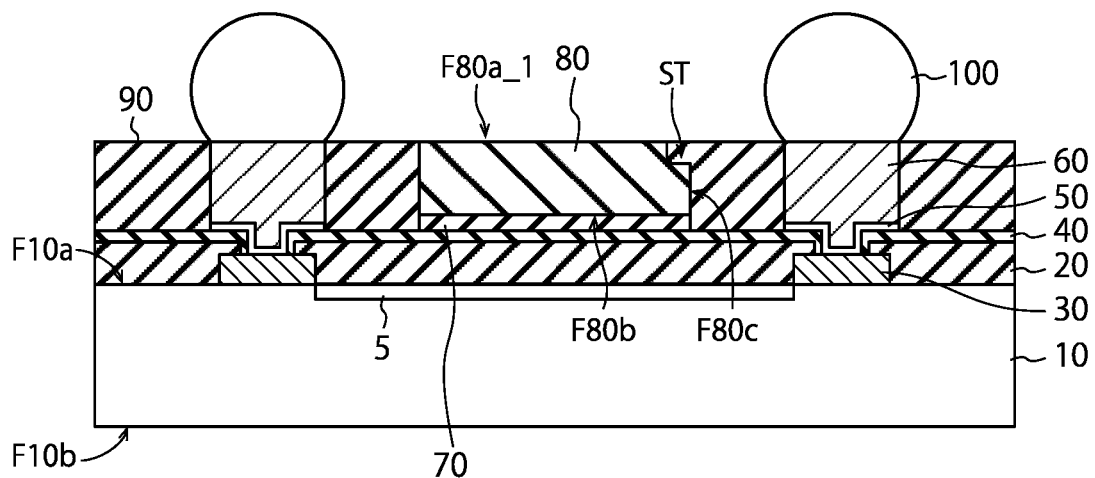

FIGS. 15 and 16 are sectional views illustrating an example of the manufacturing method and configuration of the semiconductor device 1 according to a third embodiment. FIG. 15 illustrates a configuration in the middle of manufacturing of the semiconductor device 1 and illustrates a state corresponding to FIG. 9 in the first embodiment. FIG. 16 illustrates a completed configuration of the semiconductor device 1.

In the third embodiment, the dummy member 80 has steps ST in a manner of stairs on a side surface F80c thereof. Due to the steps ST on the side surface F80c of the dummy member 80, the respective areas on the steps ST as viewed from the first face F10a differ and accordingly the polishing area of the dummy member 80 changes. Since the polishing resistance changes based on changes in the polishing area of the dummy member 80, the polishing apparatus can determine the height of a step ST of the dummy member 80 that is being polished. Setting the respective thicknesses (heights) of the steps ST of the dummy member 80 in advance, the remaining film thickness of the dummy member 80 (the remaining film thickness of the third insulating film 90) in the polishing can be controlled.

The manufacturing method according to the third embodiment is explained in more detail.

After the processes illustrated in FIGS. 2 to 7 are performed, the dummy members 80 are sticked onto the second insulating film 40 with the resin layer 70. The dummy members 80 each have an upper surface F80a, a back surface F80b, and the side surface F80c. The steps ST are formed on the side surface F80c of each of the dummy members 80. The steps ST can be formed using the lithography technique and the etching technique. Alternatively, the steps ST may be formed using a processing technique or a dicing blade. The steps ST can be formed after or before the dummy members 80 are attached onto the second insulating film 40. For example, a case where the thickness of each of the steps ST is about 10 μm and the number of the steps ST is five is assumed. In this case, a height Hst from the lowermost one of the steps ST of each of the dummy members 80 to the topmost one is about 40 μm. As viewed from above the first face F10a, the polishing area of the dummy members 80 is smallest on the topmost step of the dummy members 80 and becomes larger toward lower steps. The material of the dummy members 80 can be same as that of the dummy members 80 in the first embodiment.

Next, the third insulating film 90 is formed so as to embed the dummy members 80 and the columnar electrodes 60 in the manner as explained with reference to FIG. 9. The structure illustrated in FIG. 15 is thereby obtained.

Next, the third insulating film 90 and the columnar electrodes 60 are polished to expose the dummy members 80. At this time, the dummy members 80 are polished sequentially from an upper step to a lower step. Therefore, the polishing area of the dummy members 80 is initially small and gradually increases. Since the polishing resistance changes with changes in the polishing area of the dummy members 80, the polishing apparatus can detect at which height of a stepped portion is exposed. This enables the thickness of the third insulating film 90 to be controlled. For example, in a case where the polishing is to be stopped at a time when the upper surface of the fourth one from the topmost step of each of the dummy members 80 is exposed, the polishing apparatus stops the polishing at a time when the upper surface of the fourth step is exposed after the third one from the topmost step of each of the dummy members 80 has been polished. Accordingly, the thickness of the third insulating film 90 can be controlled to be substantially equal to the total thickness of steps that are equal to and lower than the fourth step of each of the dummy members 80 and the resin layer 70 as illustrated in FIG. 16. At this time, Hst is, for example, 10 μm.

Next, flux is applied onto the columnar electrodes 60 to form the metallic bumps 100. Next, the semiconductor wafer W is diced to singulate the semiconductor chips 10. The semiconductor device 1 illustrated in FIG. 16 is thereby completed.

A step at which the polishing is to be stopped is not particularly limited. The polishing may be stopped at a time when a third one from the topmost step of each of the dummy members 80 is exposed. The number of the steps ST is also not limited. The heights of the steps ST may be different from each other as long as they are known in advance.

As described above, according to the third embodiment, the dummy member 80 includes a third face (a polishing face) F80a_1 exposed from the third insulating film 90, a fourth face F80b corresponding to the first face F10a of the semiconductor chip, and the side surface F80c located between the third face F80a_1 and the fourth face F80b, and the side surface F80c has the steps ST in the manner of stairs. The heights (thicknesses) of the steps ST are set in advance. Accordingly, the film thickness of the third insulating film 90 can be easily controlled. Other configurations of the third embodiment can be identical to those of the first embodiment. Therefore, the third embodiment can also achieve effects identical to those of the first embodiment.

Fourth Embodiment

Figure 17:
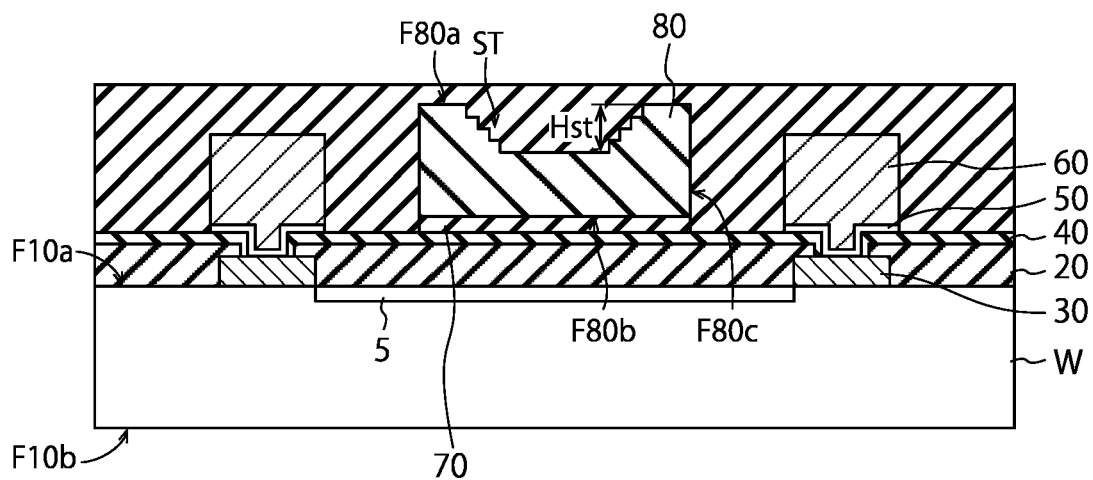
FIGS. 17 and 18 are sectional views illustrating an example of the manufacturing method and configuration of the semiconductor device according to a fourth embodiment.
Figure 18:
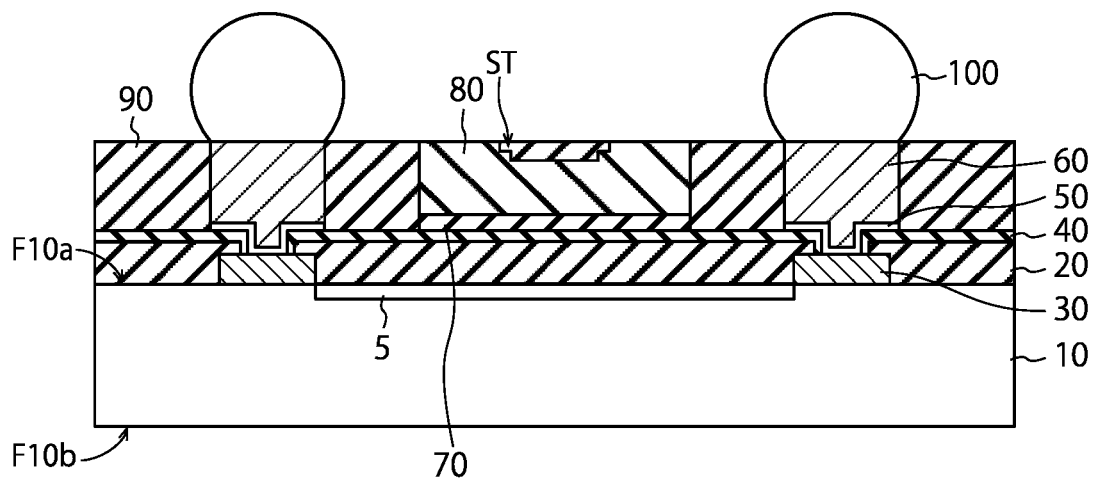

FIGS. 17 and 18 are sectional views illustrating an example of the manufacturing method and configuration of the semiconductor device 1 according to a fourth embodiment. FIG. 17 illustrates a configuration in the middle of manufacturing of the semiconductor device 1 and illustrates a state corresponding to FIG. 9 in the first embodiment. FIG. 18 illustrates a completed configuration of the semiconductor device 1.

In the fourth embodiment, the dummy member 80 has a concave portion in a central part of the upper surface F80a and steps ST in a manner of stairs on both sides of the concave portion. With the steps ST, the respective areas on the steps ST of the dummy member 80 as viewed from above the first face F10a differ and the polishing area of the dummy member 80 accordingly changes. Since the polishing resistance changes based on changes in the polishing area of the dummy member 80, the polishing apparatus can determine the height of a step ST of the dummy member 80 that is being polished. Setting the respective thicknesses (heights) of the steps ST of the dummy member 80 in advance, the remaining film thickness of the dummy member 80 (the remaining film thickness of the third insulating film 90) in the polishing can be controlled similarly in the third embodiment.

According to the fourth embodiment, the steps ST are provided on the both sides of the concave portion in the central part of the upper surface F80a. The rest of the configuration and manufacturing method in the fourth embodiment, including the number of the steps ST, the heights, and the forming method can be identical to those in the third embodiment. Therefore, the fourth embodiment can also achieve effects identical to those of the third embodiment.

Fifth Embodiment

Figure 19:
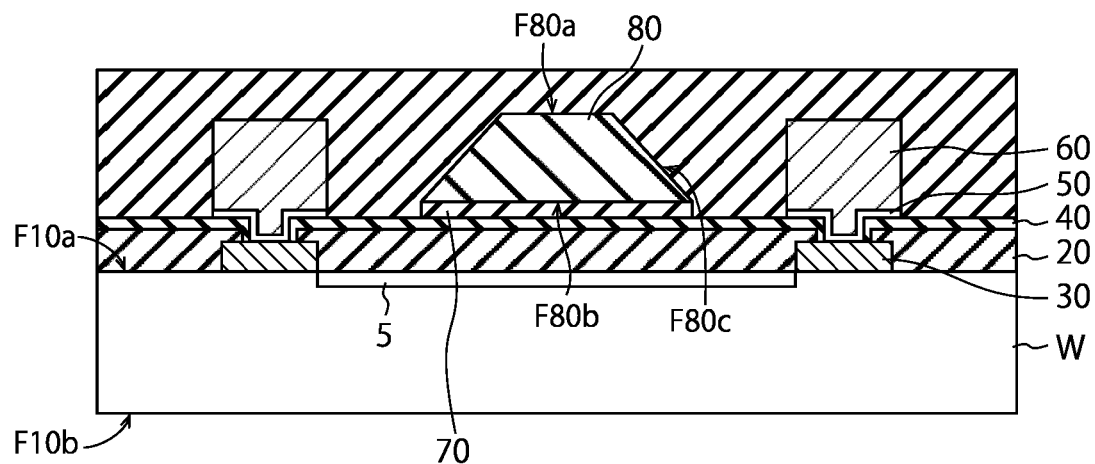
FIGS. 19 and 20 are sectional views illustrating an example of the manufacturing method and configuration of the semiconductor device according to a fifth embodiment.
Figure 20:
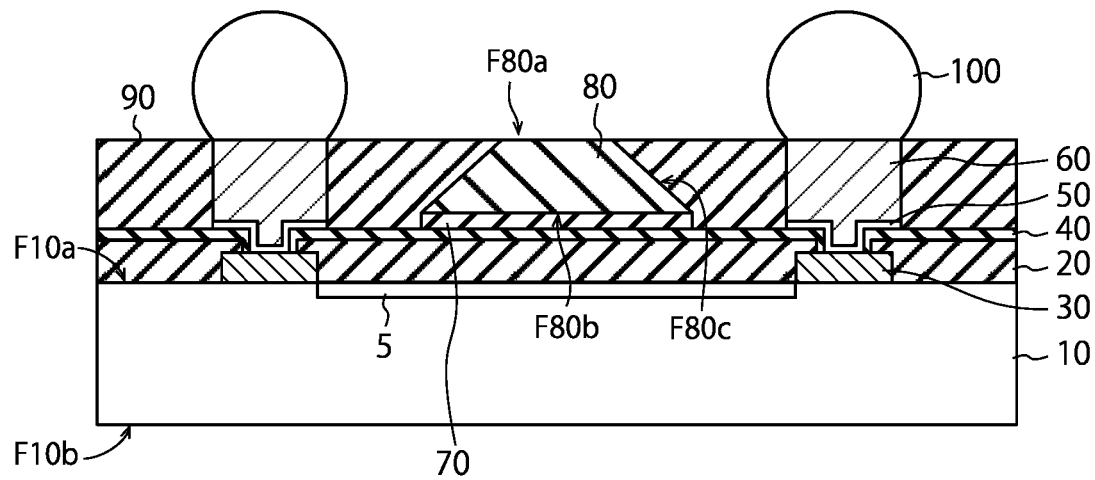

FIGS. 19 and 20 are sectional views illustrating an example of the manufacturing method and configuration of the semiconductor device 1 according to a fifth embodiment. FIG. 19 illustrates a configuration in the middle of manufacturing of the semiconductor device 1 and illustrates a state corresponding to FIG. 9 in the first embodiment. FIG. 20 illustrates a completed configuration of the semiconductor device 1.

In the fifth embodiment, the dummy member 80 has an inclination on the side surface F80c. The side surface F80c is inclined from the perpendicular direction with respect to the first face F10a. Due to the inclination of the side surface F80c of the dummy member 80, the area as viewed from above the first face F10a differs according to the height location of the polishing face of the dummy member 80 and the polishing area of the dummy member 80 accordingly changes. Since the polishing resistance changes based on changes in the polishing area of the dummy member 80, the polishing apparatus can determine the height of the polishing face of the dummy member 80 that is being polished. Setting the area of the upper surface F80a of the dummy member 80 and the inclination of the side surface F80c in advance, the remaining film thickness of the dummy member 80 (the remaining film thickness of the third insulating film 90) in the polishing can be controlled.

Since the side surface F80c of the dummy member 80 is a continuous inclined face in the fifth embodiment, the thickness of the third insulating film 90 can be more finely controlled. The rest of the configuration and manufacturing method in the fifth embodiment can be identical to those in the third and fourth embodiments. Therefore, the fifth embodiment can also achieve effects identical to those of the third and fourth embodiments.

The dummy member 80 can have, for example, a shape of any of a triangular pyramid, a quadrangular pyramid, a polygonal pyramid, and a cone with an upper part flattened. The dummy member 80 can be formed, for example, by dicing a semiconductor wafer in the inclination direction from the surface of the semiconductor wafer.

Sixth Embodiment

Figure 21:
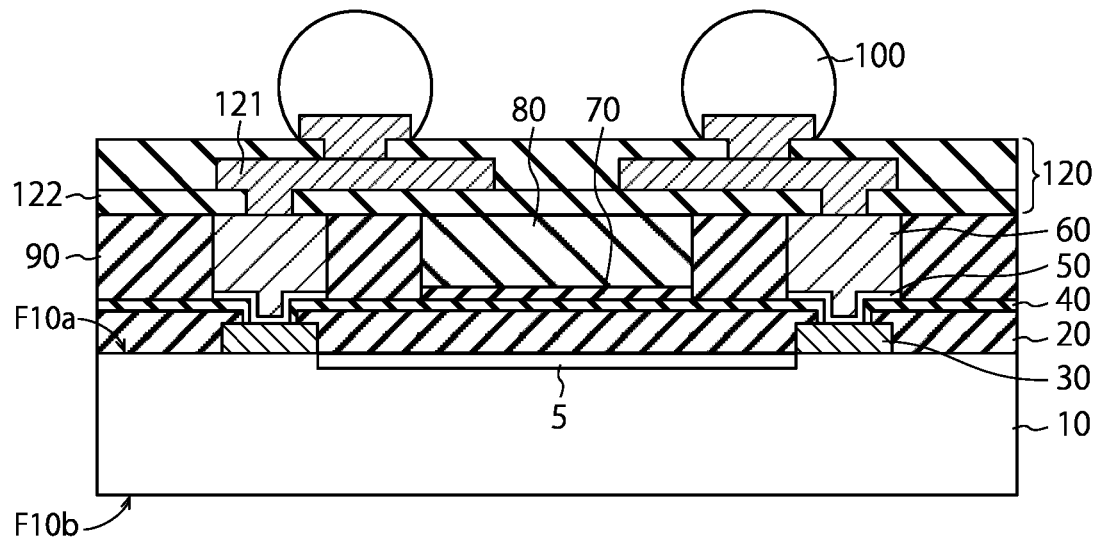
FIG. 21 is a sectional view illustrating an example of the configuration of the semiconductor device according to a sixth embodiment.

FIG. 21 is a sectional view illustrating an example of the configuration of the semiconductor device 1 according to a sixth embodiment. In the sixth embodiment, a redistribution layer (RDL) 120 is provided on the third insulating film 90. The redistribution layer 120 is located on the third insulating film 90, the columnar electrodes 60, and the dummy member 80 and has a multilayer interconnection structure obtained by stacking an interconnection layer 121 and an insulating layer 122. For example, a simple substance of Ti, TiN, Cr, CrN, Cu, Ni, Au, Pd, W, Al, or Ag, a composite membrane including two or more thereof, or an alloy including two or more thereof is used as the interconnection layer 121. For example, a phenol-based resin, a polyimide-based resin, a polyamide-based resin, an acrylic-based resin, an epoxy-based resin, a PBO-based resin, a silicon-based resin, or a benzocyclobutene-based resin, or a composite membrane including two or more thereof, or a compound including two or more thereof is used as the insulating layer 122. The columnar electrodes 60 are electrically connected to parts of the interconnection layer 121, respectively. The metallic bumps 100 are provided on electrode pads of the interconnection layer 121 and are electrically connected to parts of the interconnection layer 121, respectively. Accordingly, the metallic bumps 100 are electrically connected to the columnar electrodes 60 and any of the semiconductor elements via the redistribution layer 120. The flexibility in arrangement of the columnar electrodes 60 can be increased with use of the redistribution layer 120. The semiconductor device 1 according to the sixth embodiment may be mounted on the wiring board 200 similarly to the structure illustrated in FIG. 12.

The rest of the configuration of the sixth embodiment can be identical to the corresponding configuration of the first embodiment. Therefore, the sixth embodiment can also achieve effects identical to those of the first embodiment. Further, the sixth embodiment can be combined with any of the second to fifth embodiments.

Seventh Embodiment

Figure 22:
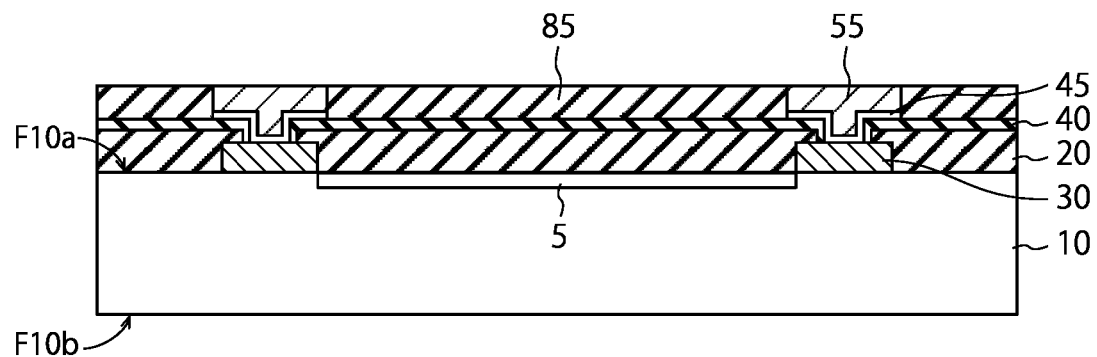
FIGS. 22 to 24 are sectional views illustrating an example of the manufacturing method and configuration of the semiconductor device according to a seventh embodiment.
Figure 23:
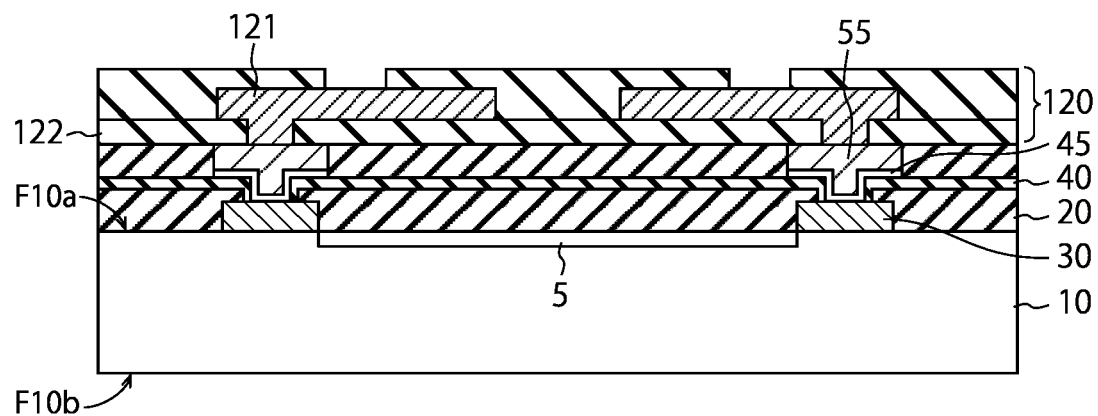
Figure 24:
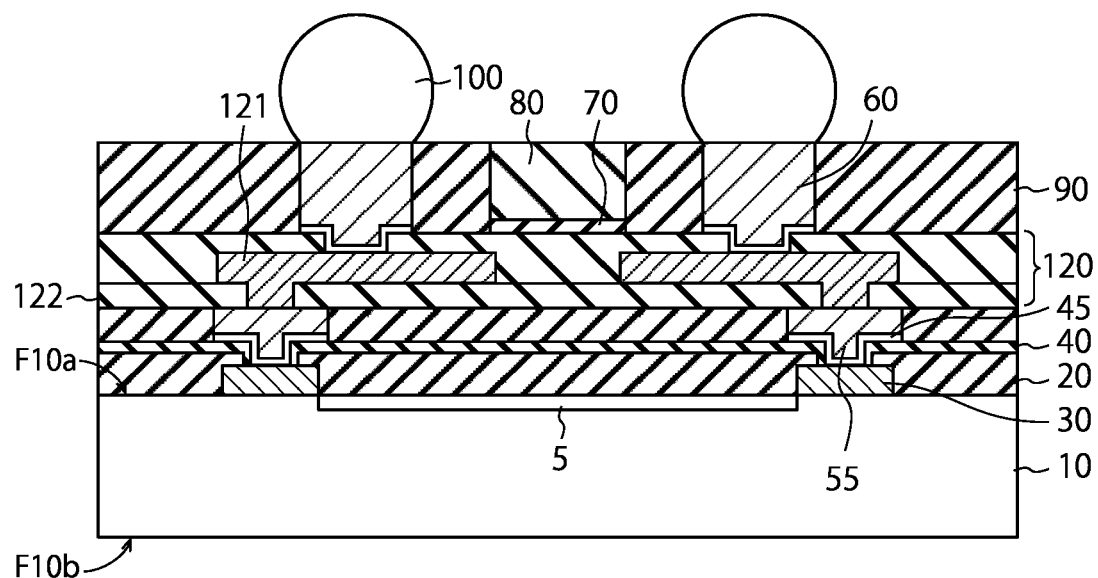

FIGS. 22 to 24 are sectional views illustrating an example of the manufacturing method and configuration of the semiconductor device 1 according to a seventh embodiment. FIGS. 22 and 23 illustrate a configuration in the middle of manufacturing of the semiconductor device 1. FIG. 24 illustrates a completed configuration of the semiconductor device 1.

In the sixth embodiment, the redistribution layer 120 is located on the columnar electrodes 60 and the dummy member 80. In contrast thereto, the redistribution layer 120 is located under the columnar electrodes 60 and the dummy member 80 in the seventh embodiment.

The manufacturing method according to the seventh embodiment is explained in more detail.

After the processes illustrated in FIGS. 2 to 7 are performed, electrodes 55 and the second insulating film 40 are covered with an insulating film 85. Since the barrier metal 50 and the columnar electrodes 60 are formed on the redistribution layer 120 in the seventh embodiment, the barrier metal 50 and the columnar electrodes 60 in FIG. 7 are herein referred to as a "barrier metal 45" and "electrodes 55", respectively. The dummy members 80 are not formed at this stage. A phenol-based resin, a polyimide-based resin, a polyamide-based resin, an acrylic-based resin, an epoxy-based resin, a PBO (p-phenylene benzobisoxazole)-based resin, a silicon-based resin, or a benzocyclobutene-based resin, or a mixed material or a composite material thereof is used as the insulating film 85. Materials of the barrier metal 45 and the electrodes 55 can be identical to those of the barrier metal 50 and the columnar electrodes 60, respectively.

After the electrodes 55 and the second insulating film 40 are covered with the insulating film 85, the electrodes 55 are exposed by lithography such as exposure and development. The structure illustrated in FIG. 22 is thereby obtained.

Next, the redistribution layer 120 is formed on the electrodes 55 and the insulating film 85 as illustrated in FIG. 23.

Subsequently, the barrier metal 50 and the columnar electrodes 60 are formed on the interconnection layer 121, and the dummy members 80 are sticked onto the insulating layer 122 with the resin layer 70 in the manner described in the first embodiment. The columnar electrodes 60 and the dummy members 80 are embedded with the third insulating film 90 and the third insulating film 90 is polished until the dummy members 80 are exposed. The metallic bumps 100 are respectively formed on the columnar electrodes 60. The semiconductor device 1 illustrated in FIG. 24 is thereby completed.

As described above, the redistribution layer 120 may be provided under the columnar electrodes 60 and the dummy member 80. The metallic bumps 100 and the columnar electrodes 60 are electrically connected to any of the semiconductor elements of the semiconductor chip 10 via the redistribution layer 120. In this case, the flexibility in layout arrangement of the columnar electrodes 60, the dummy member 80, and the metallic bumps 100 is increased.

The rest of the configuration and manufacturing method in the seventh embodiment can be identical to the corresponding configuration and manufacturing method in the sixth embodiment. Therefore, the seventh embodiment can also achieve effects identical to those of the sixth embodiment. Further, the seventh embodiment can be combined with any of the second to fifth embodiments.

Eighth Embodiment

Figure 25:
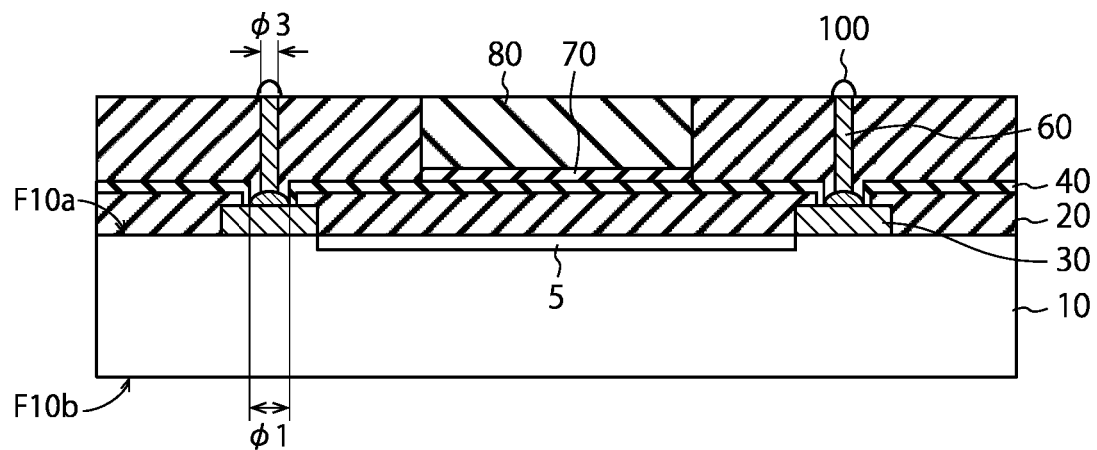
FIG. 25 is a sectional view illustrating an example of the configuration of the semiconductor device according to an eighth embodiment.

FIG. 25 is a sectional view illustrating an example of the configuration of the semiconductor device 1 according to an eighth embodiment. The eighth embodiment is different from the first embodiment in that the columnar electrodes 60 are formed by a wire bonding method using metallic wires. Hereinafter, the columnar electrodes 60 are also referred to as "metallic wires 60". In a case where the columnar electrodes 60 are formed of metallic wires, the metallic wires 60 are bonded onto the electrode pads 30 by the wire bonding method. In this case, the diameter (the width) ø3 of the metallic wires 60 is smaller than an aperture diameter ø1 of the electrode pads 30 exposed from the first and second insulating films 20 and 40. The area of the metallic wires 60 exposed from the third insulating film 90 is smaller than the contact area (bonding area) of the metallic wires 60 to the semiconductor chip 10. Further, the metallic wires 60 can be formed by the wire bonding method and are therefore lower in the manufacturing cost than electrodes formed by the plating method. These characteristics are obtained in the case where metallic wires are used as the columnar electrodes 60. A low-resistance metal such as a simple substance of Cu, Ni, W, Au, Ag, Pd, Sn, Bi, Zn, Cr, Al, or the like, a composite membrane including two or more thereof, or an alloy including two or more thereof is used as the material of the metallic wires 60. For example, a material including Cu coated with Pd may be used. It is preferable to use Cu, an alloy including Cu and Pd, or a material including Cu coated with Pd, which are relatively hard, as the metallic wires 60 so as to prevent the metallic wires 60 from collapsing during formation of the third insulating film 90.

The manufacturing method according to the eighth embodiment is explained.

After the process illustrated in FIG. 2 is performed, one ends of the metallic wires 60 are respectively bonded to the electrode pads 30 using a wire bonder. Next, the metallic wires 60 are drawn to above the first face F10a in a substantially perpendicular direction, and are cut. Accordingly, the metallic wires 60 are formed as columnar electrodes being erect in the substantially perpendicular direction with respect to the first face F10a. Subsequently, the dummy members 80, the third insulating film 90, and the metallic bumps 100 are formed in an identical manner to that in the first embodiment. The metallic bumps 100 may be formed after the metallic wires 60 are exposed and electrode pads larger than the exposed faces are subsequently formed. The semiconductor device 1 illustrated in FIG. 25 is thereby completed.

Since the columnar electrodes 60 are formed by the wire bonding method using metallic wires in the eighth embodiment, the columnar electrodes 60 can be formed more inexpensively and more easily than the plating method. The rest of the configuration and manufacturing method in the eighth embodiment can be identical to the corresponding configuration and manufacturing method in the first embodiment. Therefore, the eighth embodiment can also achieve effects identical to those of the first embodiment. Further, the eighth embodiment can be combined with any of the first to seventh embodiments.

Ninth Embodiment

Figure 26:
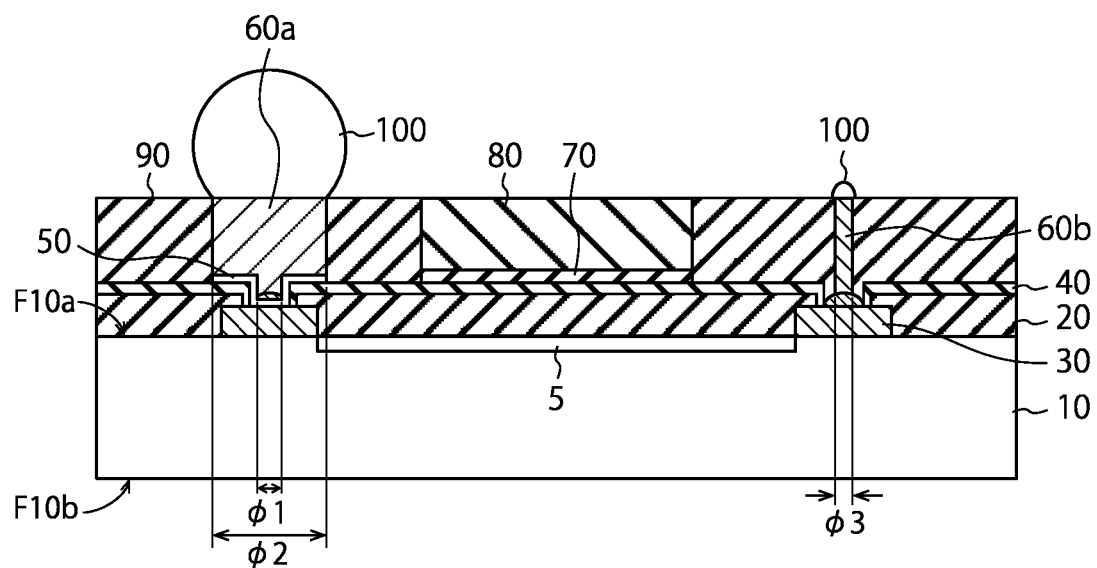
FIG. 26 is a sectional view illustrating an example of the configuration of the semiconductor device according to a ninth embodiment.

FIG. 26 is a sectional view illustrating an example of the configuration of the semiconductor device 1 according to a ninth embodiment. The ninth embodiment is different from the first embodiment in that the columnar electrodes 60 include both columnar electrodes 60a formed by the plating method and columnar electrodes (metallic wires) 60b formed by the wire bonding method. That is, the columnar electrodes 60a formed by the plating method and the columnar electrodes 60b formed by the wire bonding method are present in a mixed manner as the columnar electrodes 60.

The area of the columnar electrodes 60a exposed from the third insulating film 90 can be larger than the contact area of the columnar electrodes 60a to the semiconductor chip 10. Meanwhile, the area of the columnar electrodes 60b exposed from the third insulating film 90 can be smaller than the contact area of the columnar electrodes 60b to the semiconductor chip 10.

That is, a diameter ø2 of the columnar electrodes 60a formed by the plating method can be larger than the aperture diameter ø1 of the electrode pads 30 exposed from the first and second insulating films 20 and 40. The diameter ø3 of the metallic wires 60b formed by the bonding method can be smaller than the aperture diameter ø1 of the electrode pads 30 exposed from the first and second insulating films 20 and 40.

The rest of the configuration and manufacturing method in the ninth embodiment can be identical to the corresponding configuration and manufacturing method in the first embodiment. Therefore, the ninth embodiment can also achieve effects identical to those of the first embodiment. Further, the ninth embodiment can be combined with any of the first to seventh embodiments.

Tenth Embodiment

Figure 27:
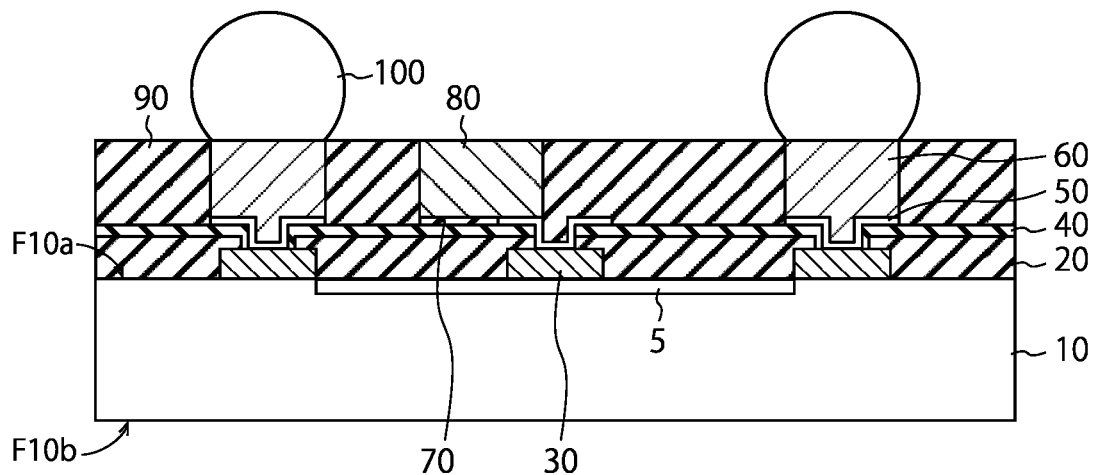
FIG. 27 is a sectional view illustrating an example of the configuration of the semiconductor device according to a tenth embodiment.

FIG. 27 is a sectional view illustrating an example of the configuration of the semiconductor device 1 according to a tenth embodiment. In the tenth embodiment, the dummy member 80 is a conductive body and an electrode pad 30 and the barrier metal 50 are provided under the dummy member 80. The dummy member 80 is in contact with the barrier metal 50 and is electrically connected to the associated electrode pad 30 and any of the semiconductor elements of the semiconductor chip 10 via the barrier metal 50.

In the tenth embodiment, the dummy member 80 has both the function as a polishing stopper and the function as an electrode. The dummy member 80 may supply power to the semiconductor chip 10 as a power electrode. For example, the dummy member 80 may be connected using solder or conductive paste. Alternatively, the dummy member 80 may supply a ground voltage to the semiconductor chip 10 as a ground electrode. The dummy member 80 may also have the function as a radiator plate that absorbs and radiates heat of the semiconductor chip 10.

The rest of the configuration and manufacturing method in the tenth embodiment can be identical to the corresponding configuration and manufacturing method in the first embodiment. Therefore, the tenth embodiment can also achieve effects identical to those of the first embodiment. Further, the tenth embodiment can be combined with any of the first to ninth embodiments.

Embodiments of a package of a stacked body of the semiconductor chips 10 are hereinafter explained.

Eleventh Embodiment

Figure 28:
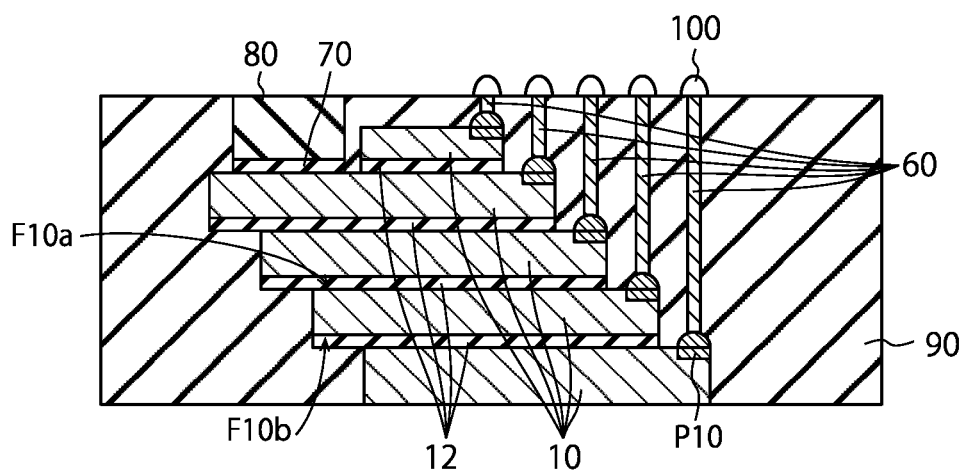
FIG. 28 is a sectional view illustrating an example of the configuration of the semiconductor device according to an eleventh embodiment.

FIG. 28 is a sectional view illustrating an example of the configuration of the semiconductor device 1 according to an eleventh embodiment. In the eleventh embodiment, a plurality of semiconductor chips 10 are stacked and the columnar electrodes 60 extend from the semiconductor chips 10 in a substantially perpendicular direction to the surfaces of the semiconductor chips 10, respectively. The dummy member 80 is arranged on the stacked body of the semiconductor chips 10 and the upper surface of the dummy member 80 is at a higher location than the surface of the topmost semiconductor chip 10. Therefore, the surface of the topmost semiconductor chip 10 is not exposed from the third insulating film 90 and is covered with the third insulating film 90.

The semiconductor chips 10 can be, for example, memory chips of a NAND flash memory or semiconductor chips having a certain LSI mounted thereon. The semiconductor chips 10 can be semiconductor chips having a same configuration or semiconductor chips having different configurations, respectively. For example, the topmost semiconductor chip 10 among the semiconductor chips 10 can be a controller chip that controls memory chips, and other semiconductor chips 10 can be the memory chips. The semiconductor chips 10 are sticked to each other with adhesive layers 12. A front surface F10a of each of the semiconductor chips 10 is an element formation face including semiconductor elements formed thereon. A back surface F10b on the opposite side to the front surface F10a is sticked to another semiconductor chip 10 with the adhesive layer 12.

The adhesive layers 12 are respectively provided between adjacent ones of the semiconductor chips 10 to stack the semiconductor chips 10. For example, a DAF (Die Attach Film) or a DAP (Die Attach Paste) including a phenol-based resin, a polyimide-based resin, a polyamide-based resin, an acrylic-based resin, an epoxy-based resin, a PBO (p-phenylene benzobisoxazole)-based resin, a silicon-based resin, or a benzocyclobutene-based resin, or a mixed material or a composite material thereof is used as the adhesive layers 12.

The columnar electrodes 60 extend in the substantially perpendicular direction to the front faces F10a of the semiconductor chips 10 and are connected to the associated semiconductor chips 10, respectively. One end of each of the columnar electrodes 60 is connected to an electrode pad P10 of the associated semiconductor chip 10 and the other end thereof is connected to an associated one of the metallic bumps 100. For example, the semiconductor chips 10 are stacked to be displaced in the manner of stairs and the columnar electrodes 60 extend from the associated electrode pads P10 that are provided at stepped portions on end portions of the semiconductor chips 10, respectively. Accordingly, each of the semiconductor chips 10 is connected to the associated metallic bump 100 via the associated columnar electrode 60 and can directly transmit and receive a signal to/from a redistribution layer or an external device without via other semiconductor chips 10. As a result, the amount of communication data and the communication rate between the semiconductor chips 10 and a controller or the like can be increased. The columnar electrodes 60 can be, for example, metallic wires used as bonding wires or can be columnar electrodes formed by the plating method. For example, the columnar electrode 60 of the topmost semiconductor chip 10 can be a columnar electrode formed by the plating method and the columnar electrodes 60 of the underlying semiconductor chips 10 can be formed of metallic wires used as bonding wires as will be described later. For example, a low-resistance metal such as a simple substance of Cu, Ni, W, Au, Ag, Pd, Sn, Bi, Zn, Cr, Al, or the like, a composite membrane including two or more thereof, or an alloy including two or more thereof is used as the columnar electrodes 60.

The dummy member 80 is attached onto the stacked body of the semiconductor chips 10 with the resin layer 70 and is arranged next to the topmost semiconductor chip 10. The upper surface of the dummy member 80 is at a higher location than the surface of the topmost semiconductor chip 10 and functions as a polishing stopper of the third insulating film 90.

The third insulating film 90 covers and protects the semiconductor chips 10 and the columnar electrodes 60. The third insulating film 90 covers the topmost semiconductor chip 10 without the surface exposed.

The metallic bumps 100 are provided on the associated columnar electrodes 60 and are provided to obtain electrical connections with other devices. For example, a low-resistance metal such as solder including Sn as a primary component is used as the metallic bumps 100. The metallic bumps 100 may be formed after the metallic wires 60 are exposed and thereafter electrode pads larger than the exposed faces are formed.

A manufacturing method of the semiconductor device 1 according to the eleventh embodiment is explained next.

Figure 29:
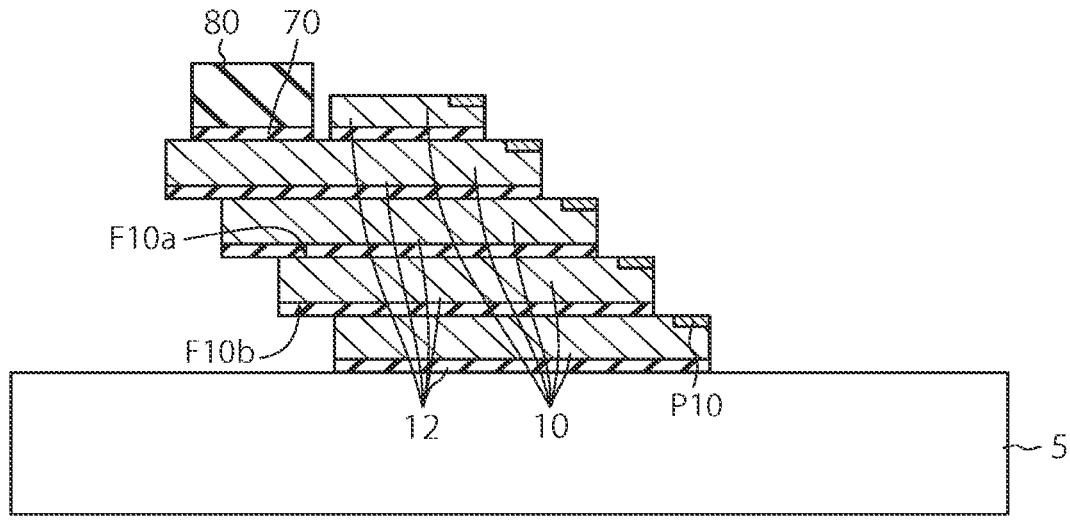
FIGS. 29 to 31 are sectional views illustrating an example of the manufacturing method of the semiconductor device according to the eleventh embodiment.
Figure 30:
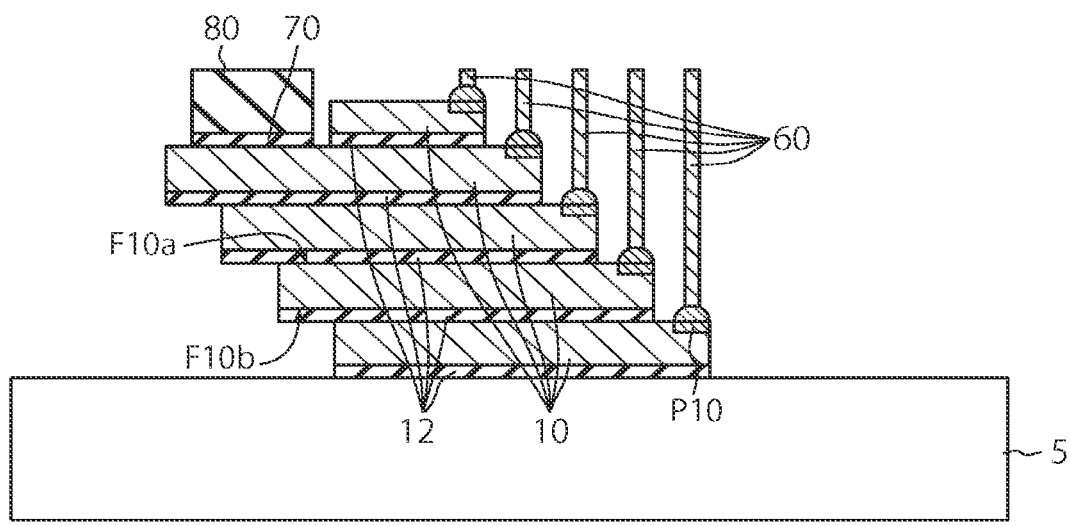
Figure 31:
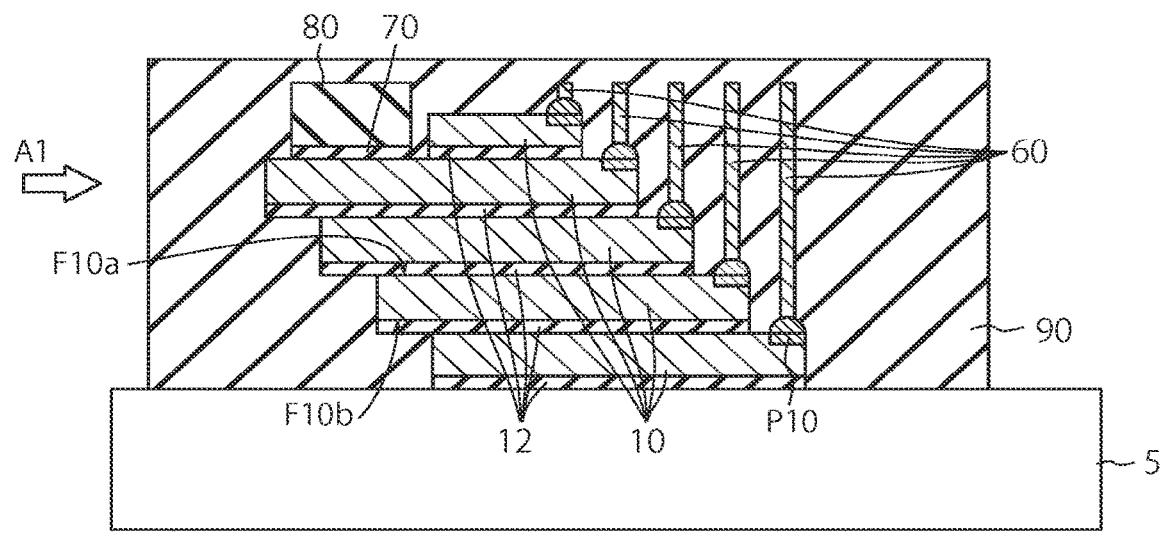

FIGS. 29 to 31 are sectional views illustrating an example of the manufacturing method of the semiconductor device 1 according to the eleventh embodiment.

First, a plurality of the semiconductor chips 10 are stacked on a support substrate 5 as illustrated in FIG. 29. At this time, each of the semiconductor chips 10 is sticked onto another semiconductor chip 10 with the adhesive layer 12.

Next, the dummy member 80 is sticked onto each stacked body of the semiconductor chips 10 with the resin layer 70. At this time, the upper surface of each of the dummy members 80 is positioned higher than the upper surface of the topmost semiconductor chip 10.

Next, metallic wires are bonded onto the electrode pads P10 of the semiconductor chips 10 by the wire bonding method and are drawn out in a substantially perpendicular direction to the first faces F10a to form the columnar electrodes 60, respectively, as illustrated in FIG. 30. The materials of some of the columnar electrodes 60 formed of metallic wires may be changed to substitute for the dummy members 80.

Next, the stacked bodies of the semiconductor chips 10, the dummy members 80, and the columnar electrodes 60 are covered with the third insulating film 90 as illustrated in FIG. 31. For example, the third insulating film 90 is a molding resin and the stacked bodies of the semiconductor chips 10, the dummy members 80, and the columnar electrodes 60 are sealed with this resin. Next, the third insulating film 90 is hardened.

Next, the third insulating film 90 is polished using the mechanical polishing method, the CMP method, or the like until the dummy members 80 are exposed. Next, the support substrate 5 is removed, and the metallic bumps 100 are subsequently formed on the columnar electrodes 60, respectively. The metallic bumps 100 can be formed using, for example, ball mounting, the plating method, or a printing method. The semiconductor device 1 illustrated in FIG. 28 is thereby completed. The support substrate 5 may be removed after formation of the metallic bumps 100.

The columnar electrodes 60 may be formed by the plating method as will be described later. In this case, after the third insulating film 90 is formed, holes reaching the electrode pards 30 are formed on the third insulating film 90 using the lithography technique and the etching technique. A metal is further embedded in the holes by the plating method. The columnar electrodes 60 may be formed in this way. The semiconductor chips 10 may be mounted after the columnar electrodes 60 are formed in advance on the semiconductor chips 10 by the plating method, or the like. While the support substrate 5 can be removed from the semiconductor device 1, the support substrate 5 may be left on the semiconductor device 1 as a radiator plate.

Figure 32:
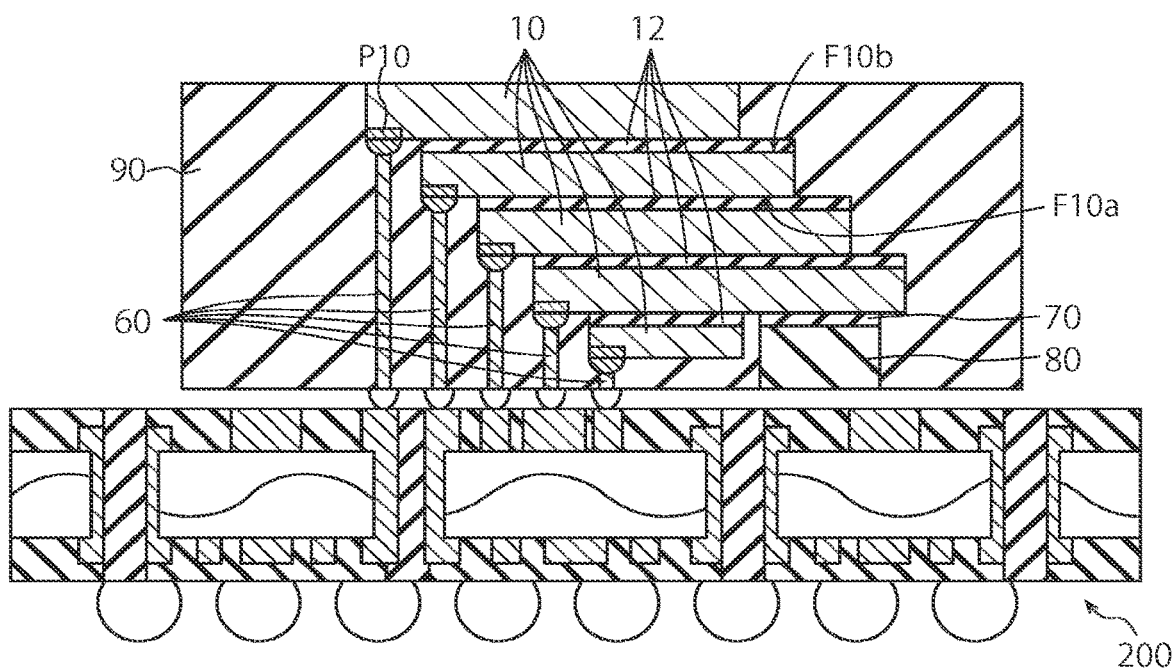
FIG. 32 is a sectional view illustrating a state in which the semiconductor device according to the eleventh embodiment is mounted on the wiring board.

The semiconductor device 1 may be mounted on the wiring board 200. FIG. 32 is a sectional view illustrating a state in which the semiconductor device 1 according to the eleventh embodiment is mounted on the wiring board 200. The semiconductor device 1 is mounted in a state where the metallic bumps 100 face the wiring board 200 and is electrically connected to parts of wiring of the wiring board 200 via the metallic bumps 100. This enables the semiconductor device 1 to be modularized with other semiconductor devices. The metallic bumps 100 may be formed on the wiring board 200. In this case, the exposed faces of the columnar electrodes 60 and the metallic bumps 100 formed on the wiring board 200 are connected to each other.

Twelfth Embodiment

Figure 33:
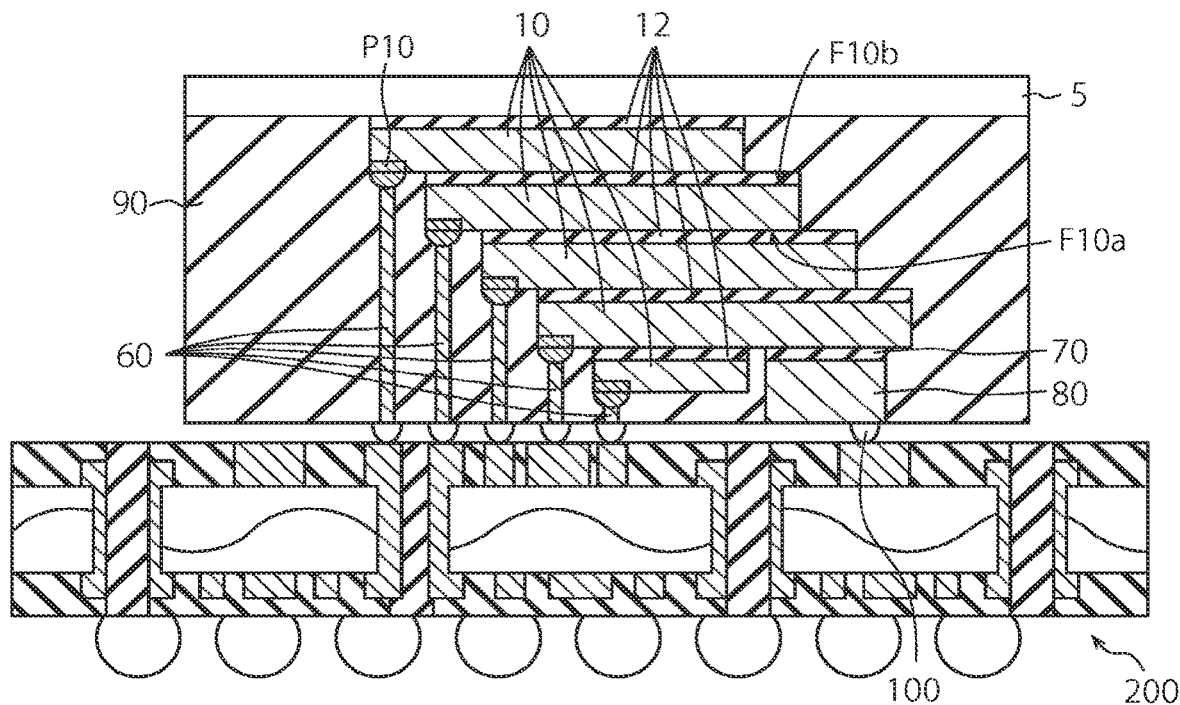
FIG. 33 is a sectional view illustrating an example of the configuration of the semiconductor device according to a twelfth embodiment.

FIG. 33 is a sectional view illustrating an example of the configuration of the semiconductor device 1 according to a twelfth embodiment. In the twelfth embodiment, the dummy member 80 is a conductive body and a metallic bump 100 is provided on the dummy member 80. The dummy member 80 is electrically connected to a part of the wiring of the wiring board 200 via the associated metallic bump 100. The dummy member 80 has both the function as a polishing stopper and the function as an electrode. The dummy member 80 may supply power to the semiconductor chips 10 as a power electrode. Alternatively, the dummy member 80 may supply the ground voltage to the semiconductor chips 10 as a ground electrode. The dummy member 80 also has the function as a radiator plate that absorbs and radiates heat of the semiconductor chips 10.

Furthermore, the support substrate 5 is left on the back surface F10b of the bottommost semiconductor chip 10 (a semiconductor chip 10 illustrated at the top in FIG. 33) in the stacked body of the semiconductor chips 10. The support substrate 5 is in contact with the back surface F10b of the bottommost semiconductor chip 10 and functions as a radiator plate. The support substrate 5 may supply the ground voltage to the semiconductor chips 10 as a ground electrode. The support substrate 5 can be, for example, a conductive body such as a metal or can be a lead frame including a thermally conductive material.

The rest of the configuration and manufacturing method in the twelfth embodiment can be identical to the corresponding configuration and manufacturing method in the eleventh embodiment. Therefore, the twelfth embodiment can also achieve effects identical to those of the eleventh embodiment.

Thirteenth Embodiment

Figure 34:
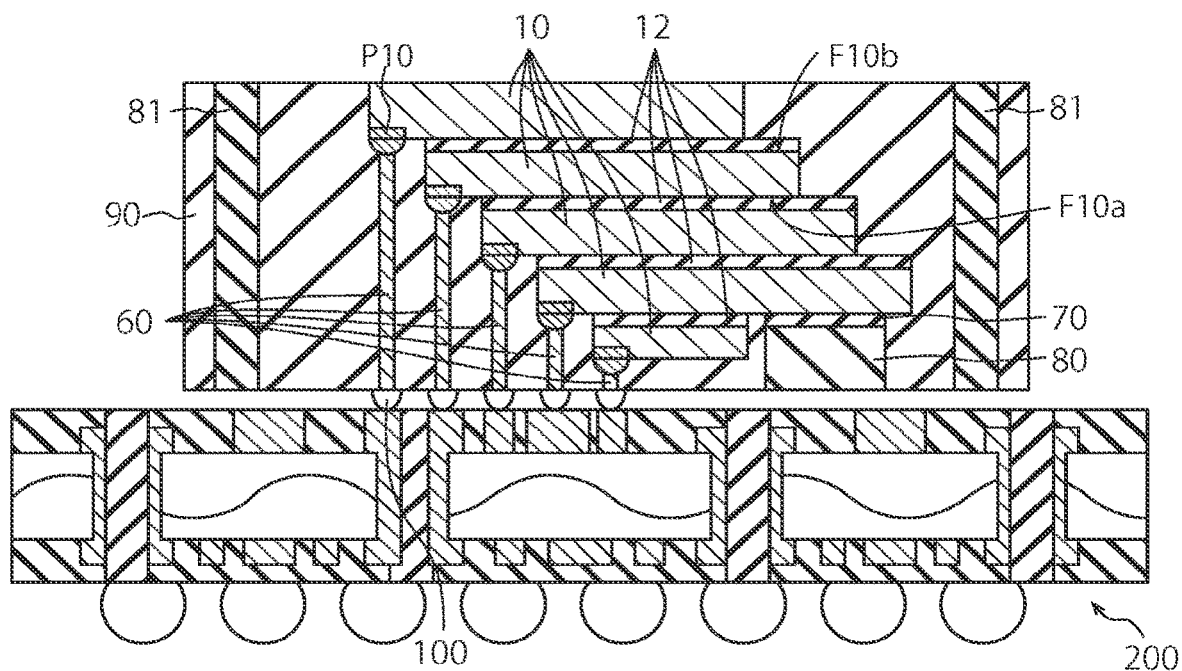
FIG. 34 is a sectional view illustrating an example of the configuration of the semiconductor device according to a thirteenth embodiment.

FIG. 34 is a sectional view illustrating an example of the configuration of the semiconductor device 1 according to a thirteenth embodiment. The thirteenth embodiment is different from the eleventh embodiment in that dummy members 81 are further provided. The dummy members 81 are provided through the third insulating film 90 in the stacking direction of the semiconductor chips 10 and are located next to the stacked body of the semiconductor chips 10. The dummy members 81 are formed of a same material as that of the dummy member 80 and are harder than the third insulating film 90 and the columnar electrodes 60. With addition of the dummy members 81, warp of the package of the semiconductor device 1 can be further suppressed.

The dummy members 81 are arranged so as to be erected on the support substrate 5 in the process illustrated in FIG. 29 or FIG. 30 before the third insulating film 90 is formed. It is preferable that the heights of the dummy members 81 are substantially equal. Thereafter, the semiconductor chips 10 are embedded with the third insulating film 90 and the third insulating film 90 is polished in the manner as explained in the eleventh embodiment. At this time, the dummy members 80 and 81 function as stoppers. The rest of the configuration and manufacturing method in the thirteenth embodiment can be identical to the corresponding configuration and manufacturing method in the eleventh embodiment. The thirteenth embodiment can be combined with any of the first to twelfth embodiments.

First Modification

In a case where the third insulating film 90 is formed by pouring a melted resin into a mold, it is preferable to pour the resin from a direction indicated by an arrow A1 in FIG. 31. The direction of the arrow A1 is a direction of the columnar electrodes as viewed from each of the stacked bodies of the semiconductor chips 10, and the flow of the resin is slowed by the stacked body of the semiconductor chips 10 and is suppressed from directly affecting the columnar electrodes 60. This can suppress collapse or bend of the columnar electrodes 60 due to the flow of the resin.

Figure 35:
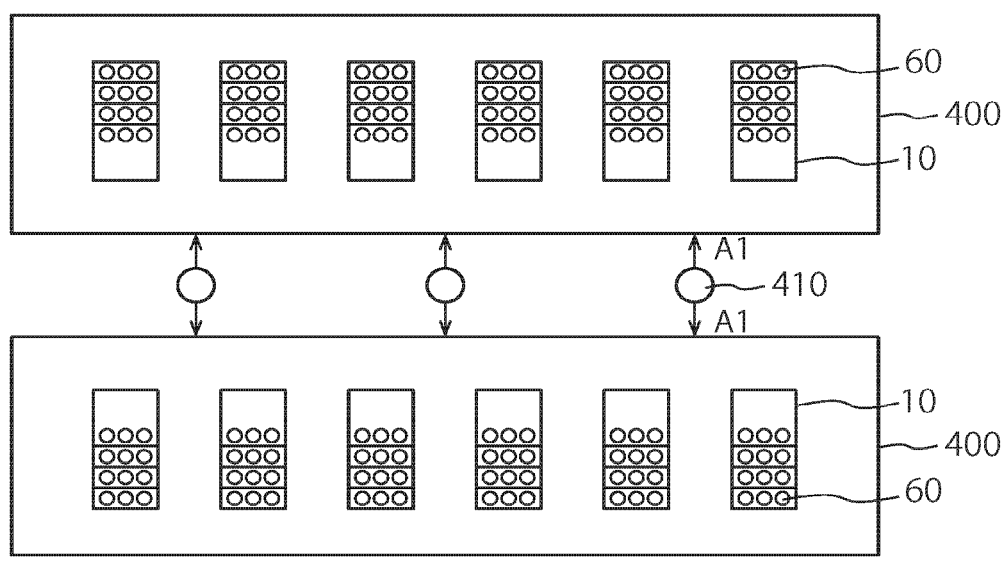
FIG. 35 is a diagram illustrating a manner of the resin sealing process according to a first modification.

FIG. 35 is a diagram illustrating a manner of the resin sealing process according to a first modification. A melted resin is introduced in directions of the arrows A1 from insertion ports 410 to be sealed into molds 400 or 401. At this time, the stacked bodies of the semiconductor chips 10 to be sealed are positioned on the upstream side of the associated columnar electrodes 60 so as to protect the columnar electrodes 60, and suppress the columnar electrodes 60 from collapsing or bending.

Second Modification

Figure 36:
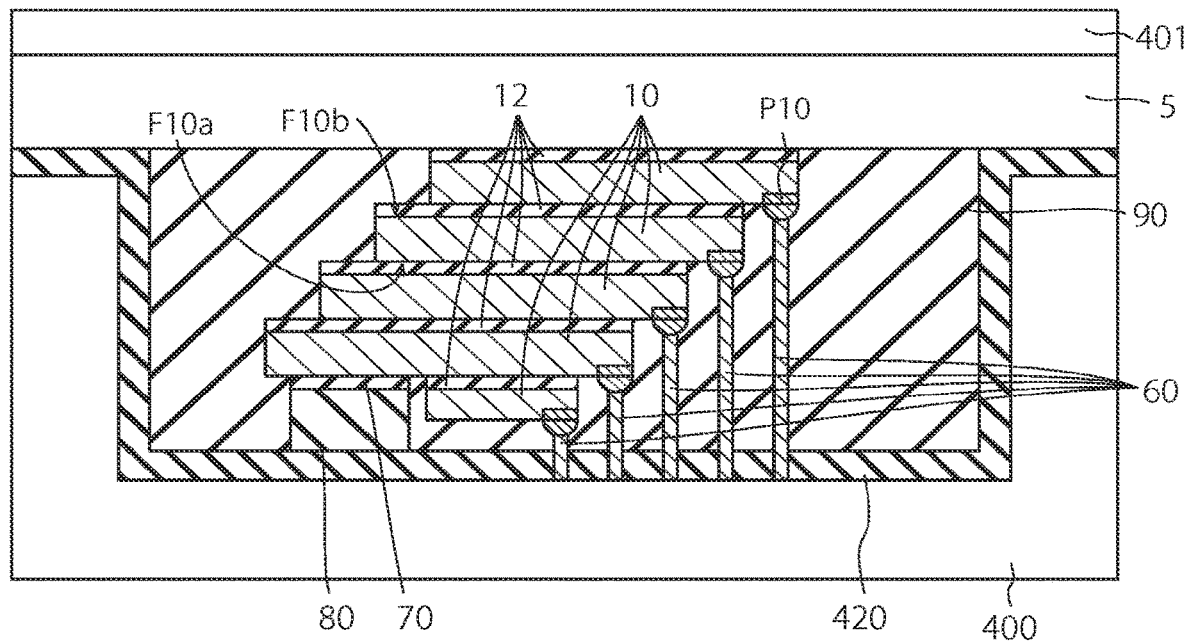
FIG. 36 is a diagram illustrating a manner of the resin sealing process according to a second modification.

FIG. 36 is a diagram illustrating a manner of the resin sealing process according to a second modification. In a case where the third insulating film 90 is formed by pouring a melted resin into the molds 400 and 401, a mold release film 420 is provided on inner surfaces of the molds 400 and 401. The mold release film 420 is provided to enable the resin-sealed semiconductor chips 10 to be easily detached from the molds and is formed of a resin or the like.

A case of resin sealing according to a compression molding method is illustrated in the second modification. The mold release film 420 is placed in the molds 400 and 401 and a resin is applied therein. Subsequently, the semiconductor chips 10 having the columnar electrodes 60 formed thereon are inverted and are input into the resin to perform compression molding. The columnar electrodes 60 are physically pierced in the mold release film 420 in the molds 400 and 401. The columnar electrodes 60 may be pushed into the mold release film 420 or may be penetrated therethrough. This enables the both ends of the columnar electrodes 60 to be fixed in the resin sealing process and suppresses the columnar electrodes 60 from being collapsed or bent due to the flow of the resin.

It is preferable that the tensile strength of the mold release film 420 is, for example, 1 MPa to 100 MPa. If the tensile strength of the mold release film 420 is lower than 1 MPa, the mold release film 420 has difficulty in fixing the columnar electrodes 60. If the tensile strength of the mold release film 420 is higher than 100 MPa, it is difficult to pierce the columnar electrodes 60 into the mold release film 420. Therefore, with the tensile strength of the mold release film 420 from 1 MPa to 100 MPa, the mold release film 420 can suppress the columnar electrodes 60 from being collapsed or bent in the resin sealing process.

Fourteenth Embodiment

Figure 37:
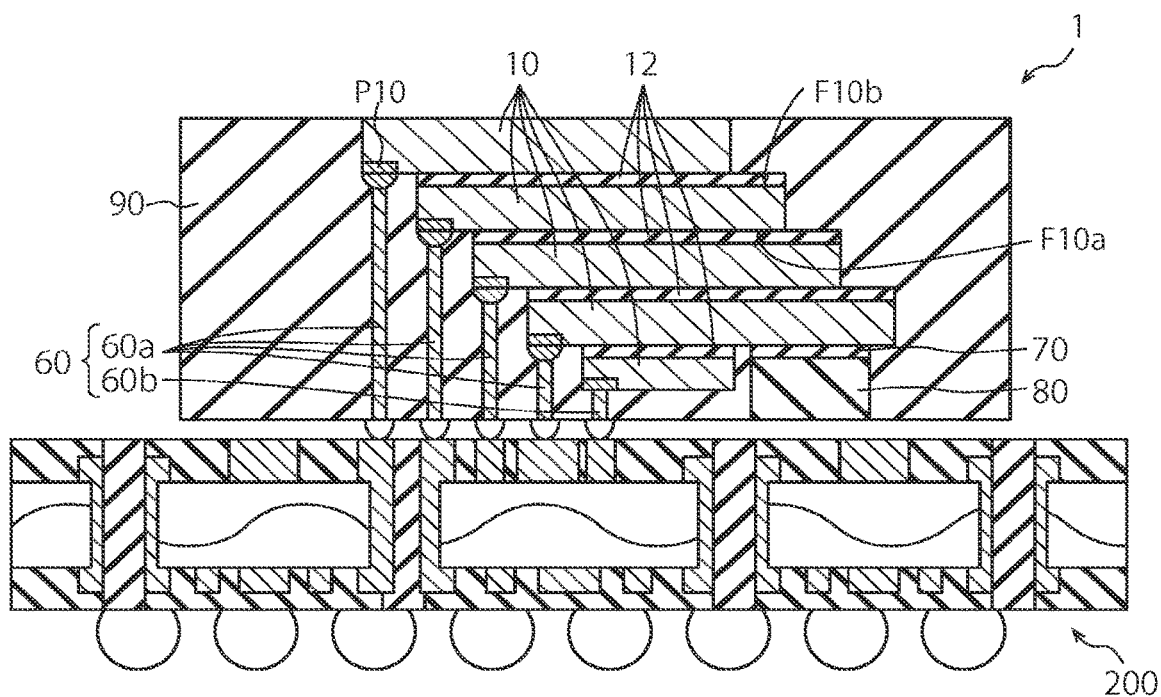
FIG. 37 is a sectional view illustrating a configuration example of the semiconductor device according to a fourteenth embodiment.

FIG. 37 is a sectional view illustrating a configuration example of the semiconductor device 1 according to a fourteenth embodiment. In the fourteenth embodiment, the columnar electrodes 60 include both the columnar electrodes 60a including bonding wires and the columnar electrodes 60b formed by the plating method. For example, the columnar electrode 60b is formed by the plating method on the topmost semiconductor chip 10b. The columnar electrodes 60a are formed on other semiconductor chips 10a by the wiring bonding method. The semiconductor chips 10a are, for example, memory chips and the semiconductor chip 10b is, for example, a controller chip.

Figure 38:
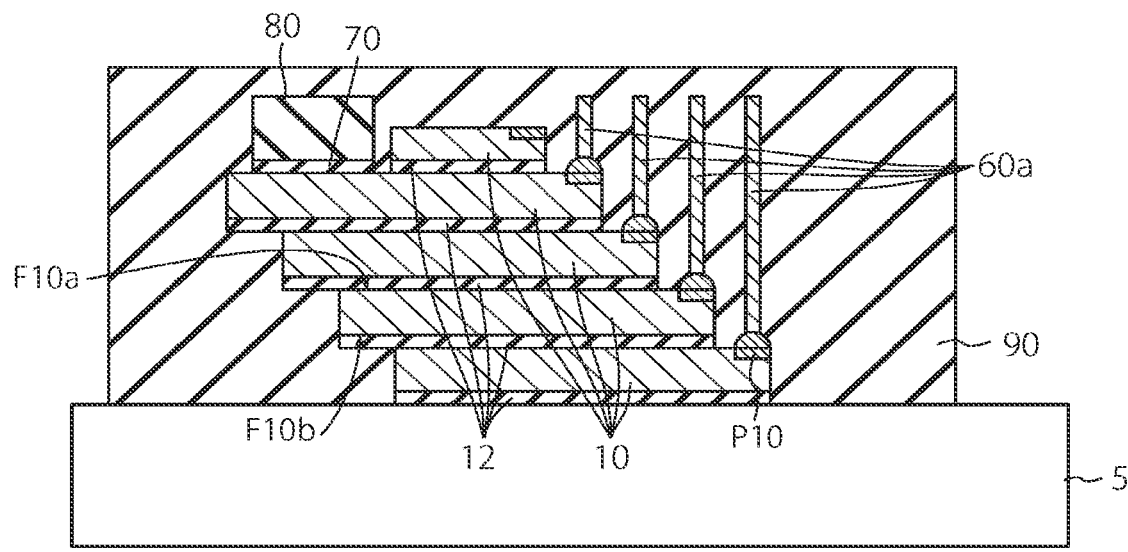
FIGS. 38 to 40 are sectional views illustrating an example of the manufacturing method of the semiconductor device according to the fourteenth embodiment.
Figure 39:
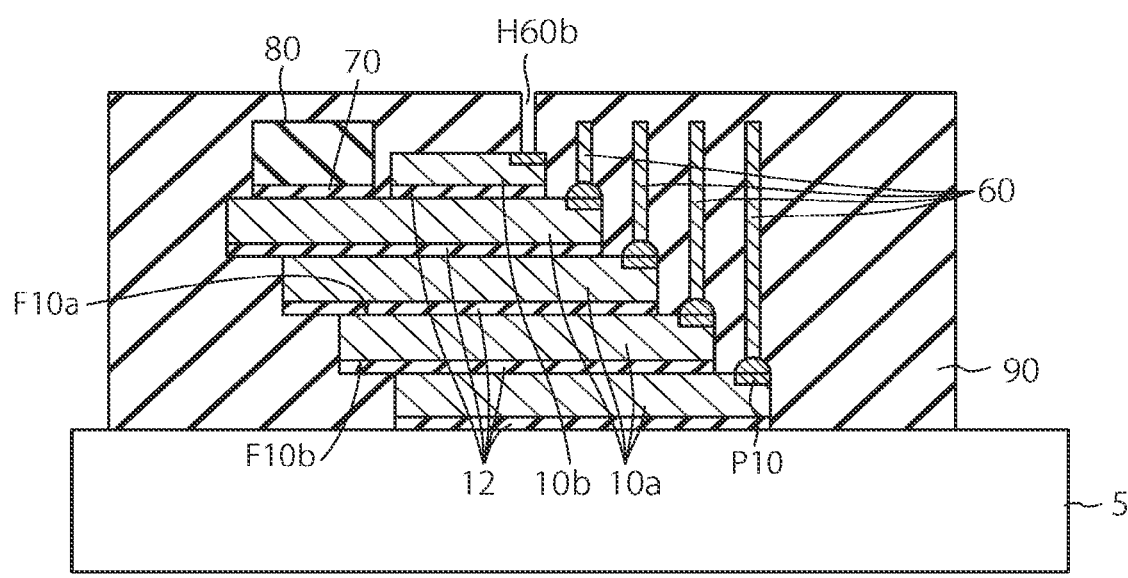
Figure 40:
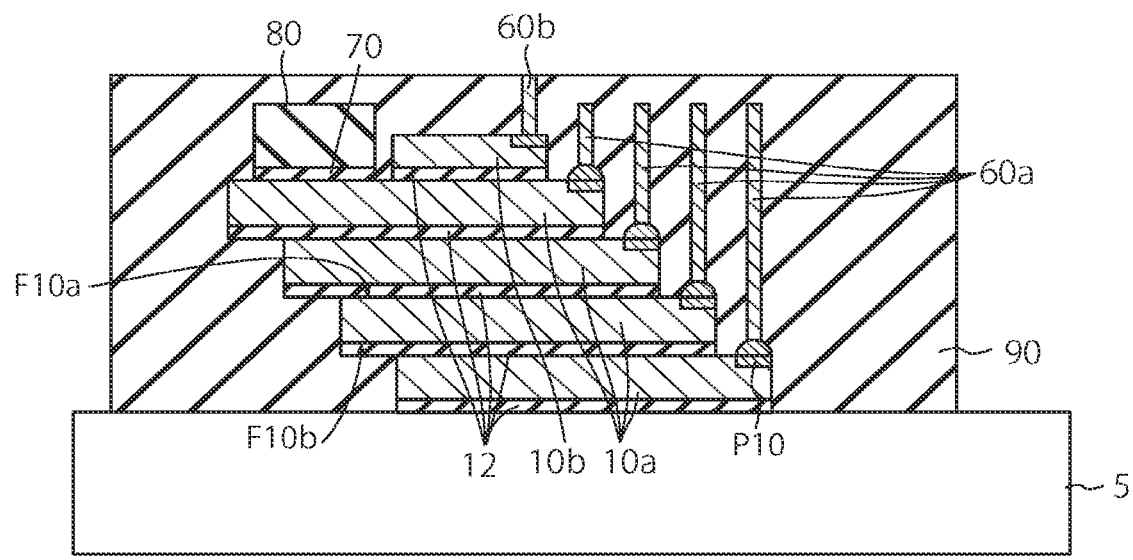

FIGS. 38 to 40 are sectional views illustrating an example of the manufacturing method of the semiconductor device 1 according to the fourteenth embodiment. The columnar electrodes 60a are formed in the manner explained with reference to FIGS. 29 to 31. A structure illustrated in FIG. 38 is thereby obtained. Subsequently, formation locations of the columnar electrodes 60b on the third insulating film 90 are ground by the laser processing technique or the like as illustrated in FIG. 39. Accordingly, holes H60b are formed on the third insulating film 90. The holes H60b are formed from the upper surface of the third insulating film 90 to the electrode pads P10 of the associated semiconductor chips 10b.

Next, after a barrier metal is formed on the electrode pads P10 of the semiconductor chips 10b, a metallic material of the columnar electrodes 60b is filled in the holes H60b using the plating method as illustrated in FIG. 40. The columnar electrodes 60b are thereby formed. The semiconductor chips 10 may be mounted after the columnar electrodes 60 are respectively formed in advance on the associated semiconductor chips 10 by the plating method or the like.

Subsequently, the third insulating film 90 and the columnar electrodes 60a and 60b are polished using the mechanical polishing method or the CMP method until the dummy members 80 are exposed. The metallic bumps 100 are further formed on the associated columnar electrodes 60a and 60b, whereby the semiconductor device 1 illustrated in FIG. 37 is completed.

Fifteenth Embodiment

Figure 41:
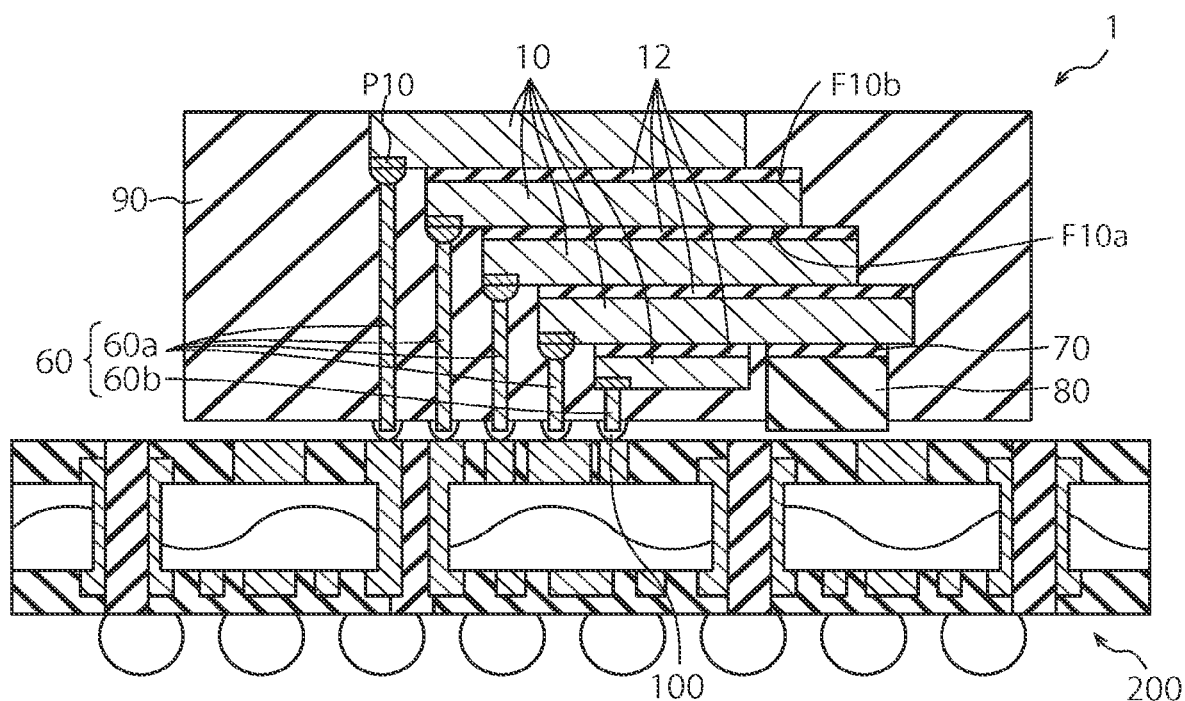
FIG. 41 is a sectional view illustrating a configuration example of the semiconductor device according to a fifteenth embodiment.

FIG. 41 is a sectional view illustrating a configuration example of the semiconductor device 1 according to a fifteenth embodiment. In the fifteenth embodiment, the columnar electrodes 60a and 60b protrude from the surface of the third insulating film 90 into the metallic bumps 100. Due to piercing of the columnar electrodes 60a and 60b into the metallic bumps 100, the semiconductor device 1 is stably connected to the wiring board 200 when the semiconductor device 1 is flip-chip connected to the wiring board 200, which leads to suppression of defects.

Protruding shapes of the columnar electrodes 60a and 60b can be formed by polishing the third insulating film 90 and subsequently further etching only the third insulating film 90 with plasma or the like. The dummy members 80 also have a protruding shape.

The rest of the configuration of the fifteenth embodiment can be identical to the corresponding configuration of the fourteenth embodiment. The fifteenth embodiment can be combined with any of the twelfth and thirteenth embodiments.

Sixteenth Embodiment

Figure 42:
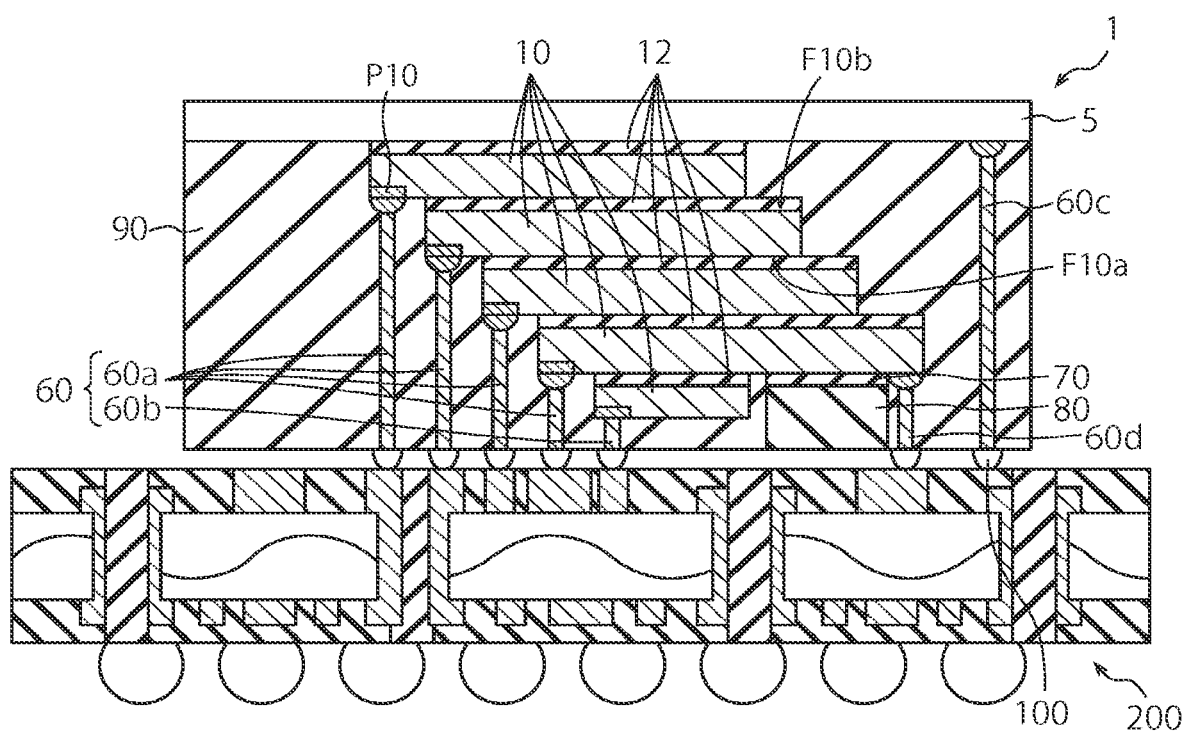
FIG. 42 is a sectional view illustrating a configuration example of the semiconductor device according to a sixteenth embodiment.

FIG. 42 is a sectional view illustrating a configuration example of the semiconductor device 1 according to a sixteenth embodiment. The semiconductor device 1 according to the sixteenth embodiment further includes dummy columnar electrodes 60c and 60d. One end of the dummy columnar electrode 60c is bonded to the support substrate 5 and the other end is provided on the surface of the third insulating film 90. One end of the dummy columnar electrode 60d is bonded to any of the semiconductor chips 10 and the other end is provided on the surface of the third insulating film 90. The metallic bumps 100 are provided at the other ends of the dummy columnar electrodes 60c and 60d, respectively, and are connected to the wiring board 200. In a case where the columnar electrodes 60 are unevenly distributed on one side of the semiconductor device 1, the dummy columnar electrodes 60c and 60d are provided on the other side. Accordingly, arrangement locations of the metallic bumps 100 between the semiconductor device 1 and the wiring board 200 are relatively uniformized and stress in a thermal cycle test is reduced. This leads to an increase in the reliability. The dummy columnar electrodes 60c and 60d may be electrically connected to the semiconductor chips 10 and the wiring board 200 or may be unconnected thereto.

Layout arrangement of the dummy columnar electrodes 60c and 60d, and the number thereof are set so as to relatively uniform the arrangement locations of the metallic bumps 100 between the semiconductor device 1 and the wiring board 200. The diameter and material of the dummy columnar electrodes 60c and 60d can be identical to those of the columnar electrodes 60a and 60b or may be different therefrom. For example, the material of the dummy columnar electrodes 60c and 60d may be changed from the material of the columnar electrodes 60a and 60b to be caused to function as the dummy members 80. The rest of the configuration of the sixteenth embodiment can be identical to the corresponding configuration of the fifteenth embodiment. The sixteenth embodiment can be also combined with any of the twelfth and thirteenth embodiments.

Seventeenth Embodiment

Figure 43:
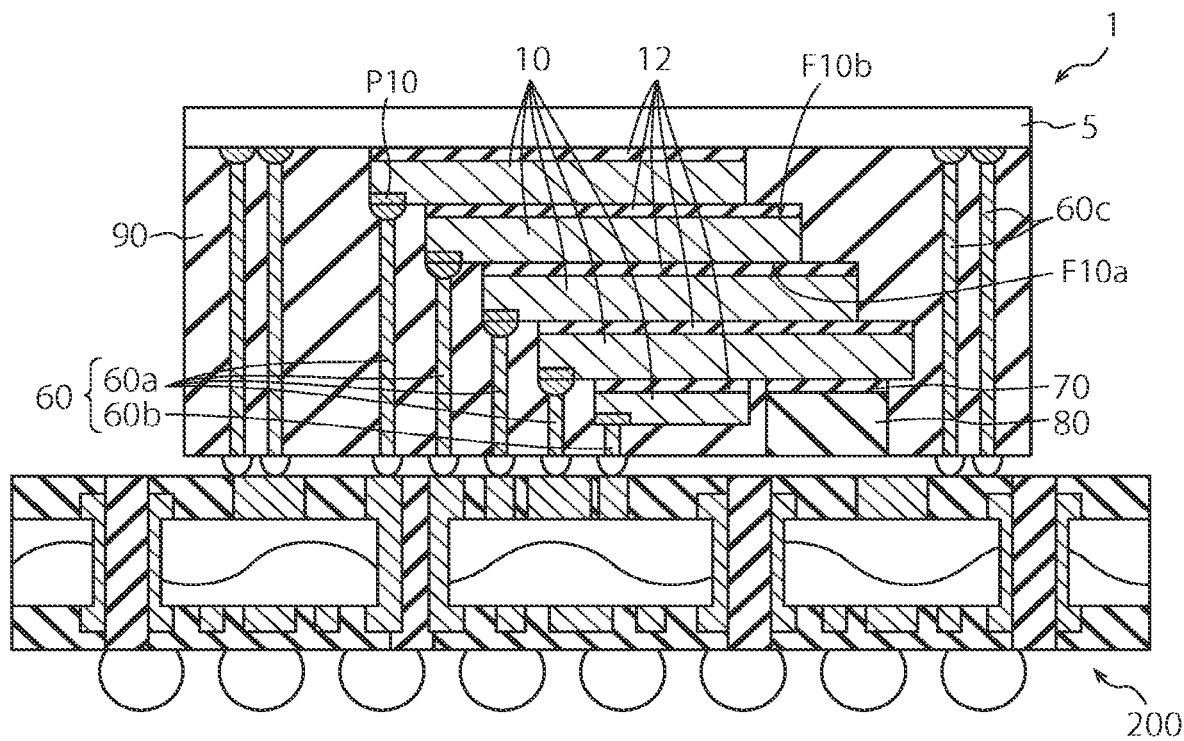
FIG. 43 is a sectional view illustrating a configuration example of the semiconductor device according to a seventeenth embodiment.
Figure 44:
FIG. 44 is a plan view illustrating the configuration example of the semiconductor device according to the seventeenth embodiment.

FIG. 43 is a sectional view illustrating a configuration example of the semiconductor device 1 according to a seventeenth embodiment. FIG. 44 is a plan view illustrating the configuration example of the semiconductor device 1 according to the seventeenth embodiment. According to the seventeenth embodiment, a plurality of the dummy columnar electrodes 60c are provided on both sides of the semiconductor device 1 or corner portions thereof. The dummy columnar electrodes 60c can have a configuration identical to that in the sixteenth embodiment. Accordingly, the arrangement locations of the metallic bumps 100 between the semiconductor device 1 and the wiring board 200 are relatively uniformized and stress in a thermal cycle test is reduced similarly in the sixteenth embodiment. As a result, the reliability can be increased. The dummy columnar electrodes 60c can be alignment marks when the semiconductor device 1 is flip-chip connected to the wiring board 200.

The layout arrangement of the dummy columnar electrodes 60c and the number thereof are not limited thereto and it suffices to set the layout arrangement and the number so as to relatively uniformize the arrangement locations of the metallic bumps 100 between the semiconductor device 1 and the wiring board 200. The diameters and materials of the dummy columnar electrodes 60c can be same or different from each other. The rest of the configuration of the seventeenth embodiment can be identical to the corresponding configuration of the fourteenth embodiment. The seventeenth embodiment can be also combined with any of the twelfth and thirteenth embodiments.

Eighteenth Embodiment

Figure 45:
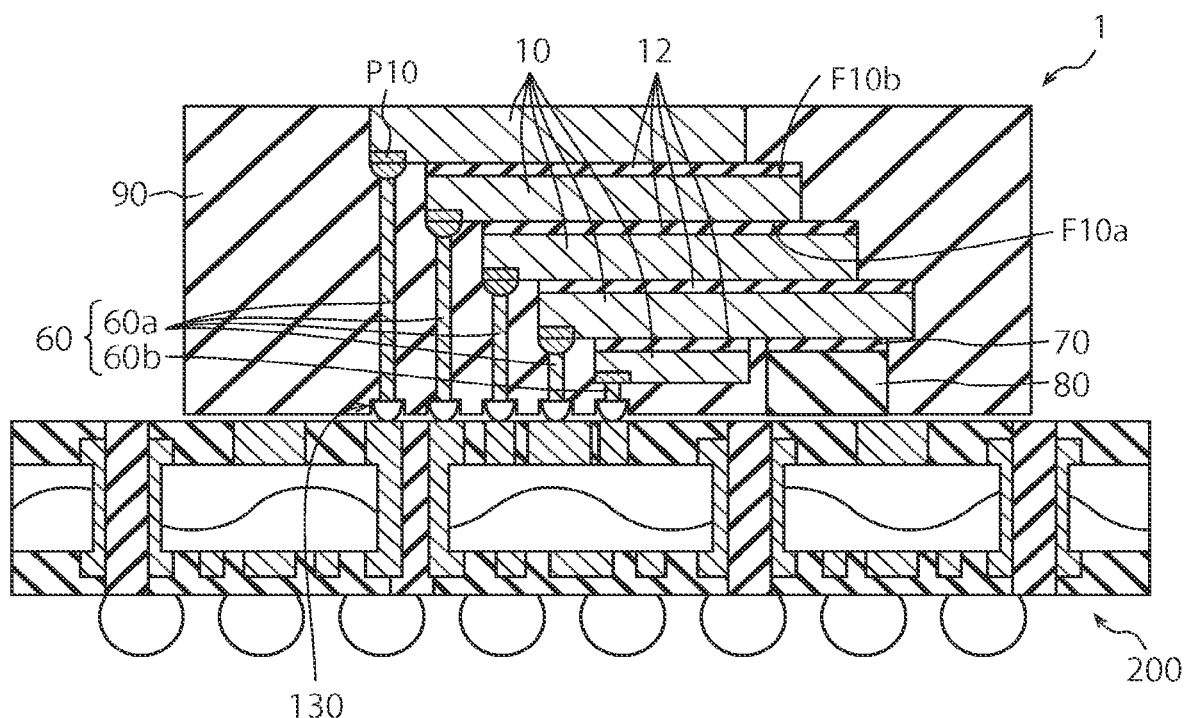
FIG. 45 is a sectional view illustrating a configuration example of the semiconductor device according to an eighteenth embodiment.

FIG. 45 is a sectional view illustrating a configuration example of the semiconductor device 1 according to an eighteenth embodiment. According to the eighteenth embodiment, concave portions 130 are provided on the surface of the third insulating film 90 and the metallic bumps 100 are provided in the concave portions 130, respectively. With formation of the metallic bumps 100 in the concave portions 130, the metallic bumps 100 can be retained in the concave portions 130 even when the metallic bumps 100 are melted due to reflow or the like. Therefore, the metallic bumps 100 can reliably connect the columnar electrodes 60 to the wiring board 200. The rest of the configuration of the eighteenth embodiment can be identical to the corresponding configuration of the fourteenth embodiment. The concave portions 130 can be formed by performing the process illustrated in FIG. 31, subsequently polishing the third insulating film 90, and removing the third insulating film 90 around the columnar electrodes 60 using the lithography technique and the etching technique or the laser processing technique. The eighteenth embodiment can be combined with any of the twelfth to seventeenth embodiments.

Nineteenth Embodiment

Figure 46:
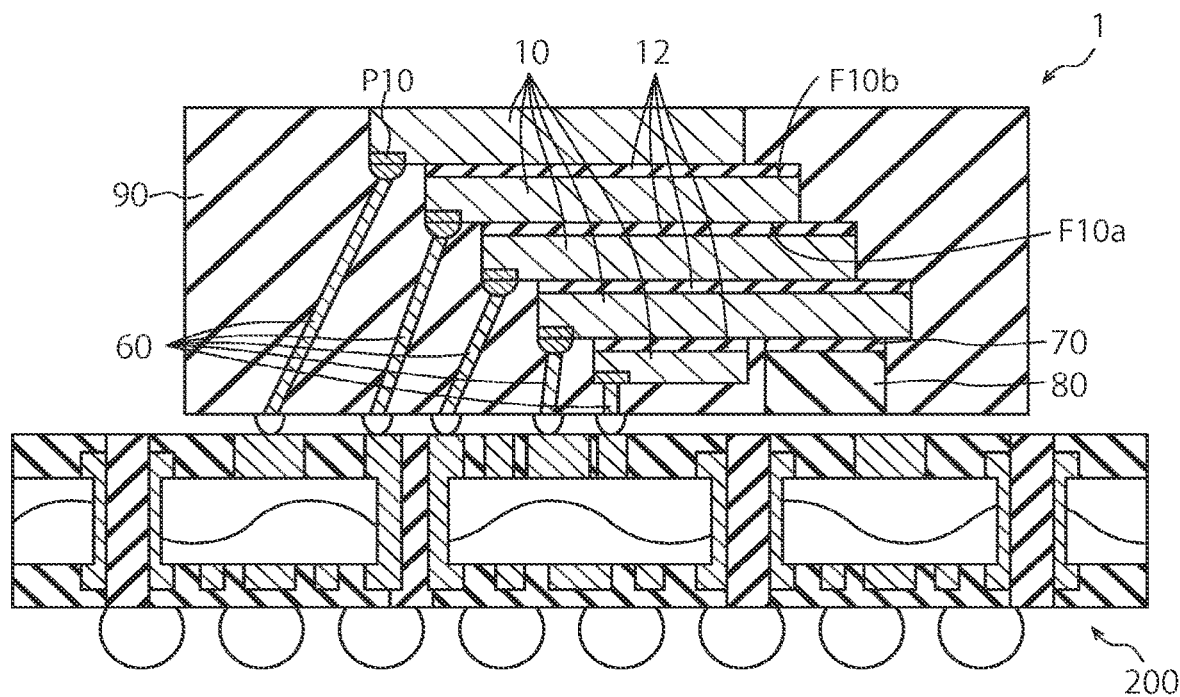
FIG. 46 is a sectional view illustrating a configuration example of the semiconductor device according to a nineteenth embodiment.

FIG. 46 is a sectional view illustrating a configuration example of the semiconductor device 1 according to a nineteenth embodiment. According to the nineteenth embodiment, the columnar electrodes 60 are provided in the third insulating film 90 to be inclined from a perpendicular direction to the first faces F10a, respectively. The columnar electrodes 60 splay outward from a central portion of the semiconductor device 1 as approaching the surface of the third insulating film 90 from connection portions with respect to the semiconductor chips 10, and intervals between the columnar electrodes 60 also increase. Accordingly, the wiring interval on the wiring board 200 is extended and the flexibility in the design of wiring of the wiring board 200 is increased. The rest of the configuration of the nineteenth embodiment can be identical to the corresponding configuration of the fourteenth embodiment. The nineteenth embodiment can be also combined with any of the twelfth to eighteenth embodiments.

Twentieth Embodiment

Figure 47:
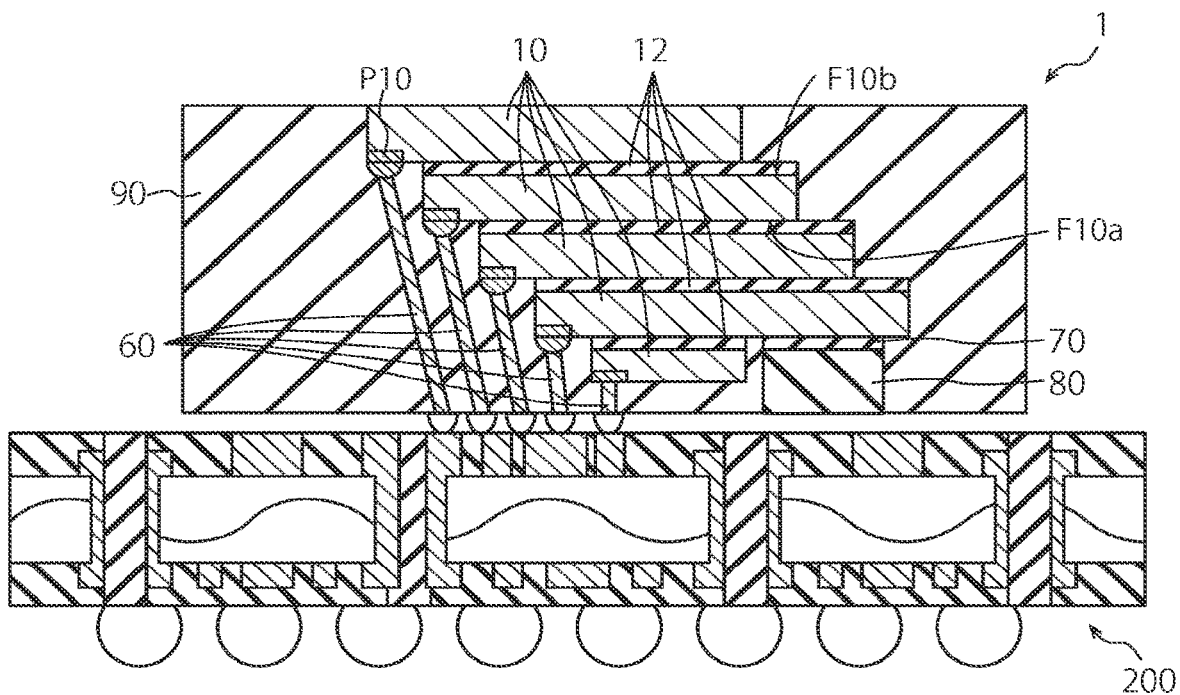
FIG. 47 is a sectional view illustrating a configuration example of the semiconductor device according to a twentieth embodiment.

FIG. 47 is a sectional view illustrating a configuration example of the semiconductor device 1 according to a twentieth embodiment. The twentieth embodiment is same as the nineteenth embodiment in that the columnar electrodes 60 are provided in the third insulating film 90 to be inclined from the perpendicular direction to the first faces F10a, respectively. However, in the twentieth embodiment, the columnar electrodes 60 narrow inward from a central portion of the semiconductor device 1 as approaching the surface of the third insulating film 90 from connection portions with respect to the semiconductor chips 10, and intervals between the columnar electrodes 60 also decrease. Accordingly, for example, the wiring distances between the semiconductor chip 10b being a controller, and other semiconductor chips 10a being memory chips are shortened and the electrical characteristics of the semiconductor device 1 are improved. The rest of the configuration of the twentieth embodiment can be identical to the corresponding configuration of the fourteenth embodiment. The twentieth embodiment can be also combined with any of the twelfth to eighteenth embodiments.

Twenty-First Embodiment

Figure 48:
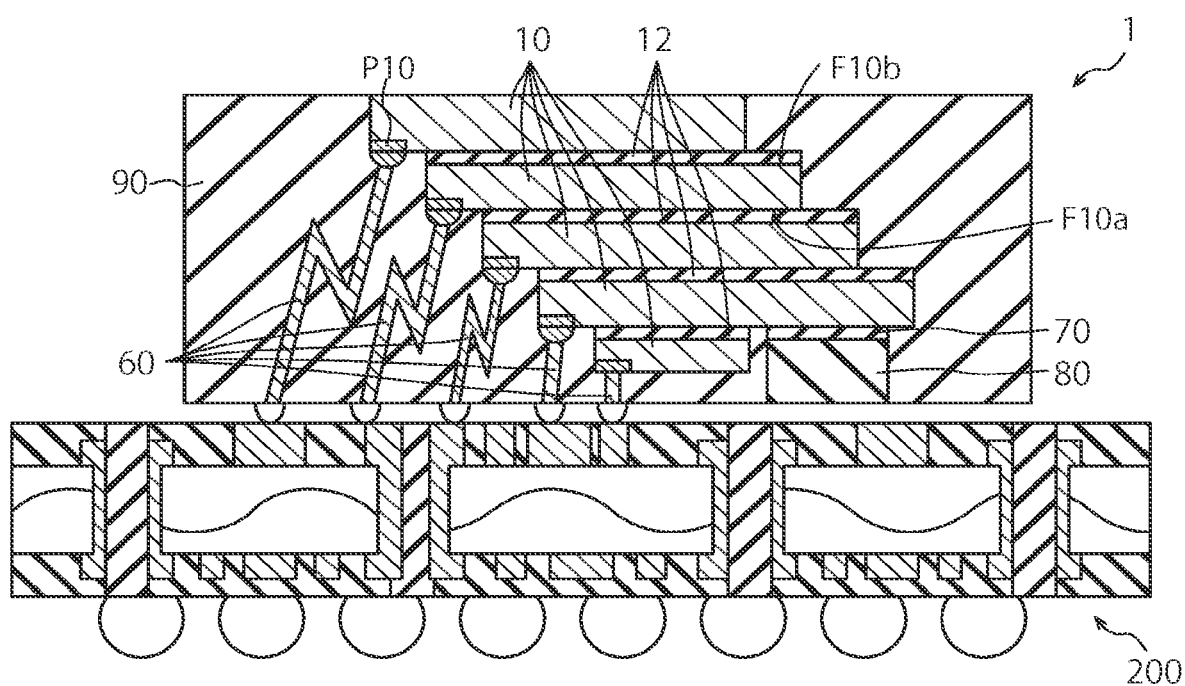
FIG. 48 is a sectional view illustrating a configuration example of the semiconductor device according to a twenty-first embodiment.

FIG. 48 is a sectional view illustrating a configuration example of the semiconductor device 1 according to a twenty-first embodiment. The twenty-first embodiment is different from the nineteenth embodiment in that the columnar electrodes 60 are inclined from the perpendicular direction to the first faces F10a in the third insulating film 90 and are provided to be bent. It is preferable that the columnar electrodes 60 are bent in a shape that can reinforce the columnar electrodes 60 to prevent the columnar electrodes 60 from being affected at the time of introduction of the third insulating film 90. For example, the columnar electrodes 60 may be folded in a substantially parallel direction to the direction of the arrow A1 in FIG. 31 to form Z shapes. Accordingly, the columnar electrodes 60 have a spring-like shape and can obtain a mechanical resistance to the flow of the third insulating film 90. The rest of the configuration of the twenty-first embodiment can be identical to the corresponding configuration of the nineteenth embodiment. The twenty-first embodiment can be also combined with any of the twelfth to eighteenth embodiments.

Twenty-Second Embodiment

FIGS. 49 to 52 are sectional views illustrating a configuration example of the semiconductor device 1 according to a twenty-second embodiment. According to the twenty-second embodiment illustrated in FIGS. 49 and 50, the semiconductor device 1 is covered with an underfill 510 and an insulant 500 on the wiring board 200. The underfill 510 is filled between the semiconductor device 1 and the wiring board 200 and covers around the metallic bumps 100 for protection. Accordingly, the reliability of the connection portion between the semiconductor device 1 and the wiring board 200 is increased. For example, a resin is used as the underfill 510. The insulant 500 is provided to cover all of the semiconductor device 1 and the underfill 510. The insulant 500 protects the semiconductor device 1 and the underfill 510. For example, a resin is used as the insulant 500 similarly to the third insulating film 90. This further increases the reliability of the semiconductor device 1. The rest of the configuration of the twenty-second embodiment can be identical to the corresponding configuration of the fourteenth embodiment.

Figure 49:
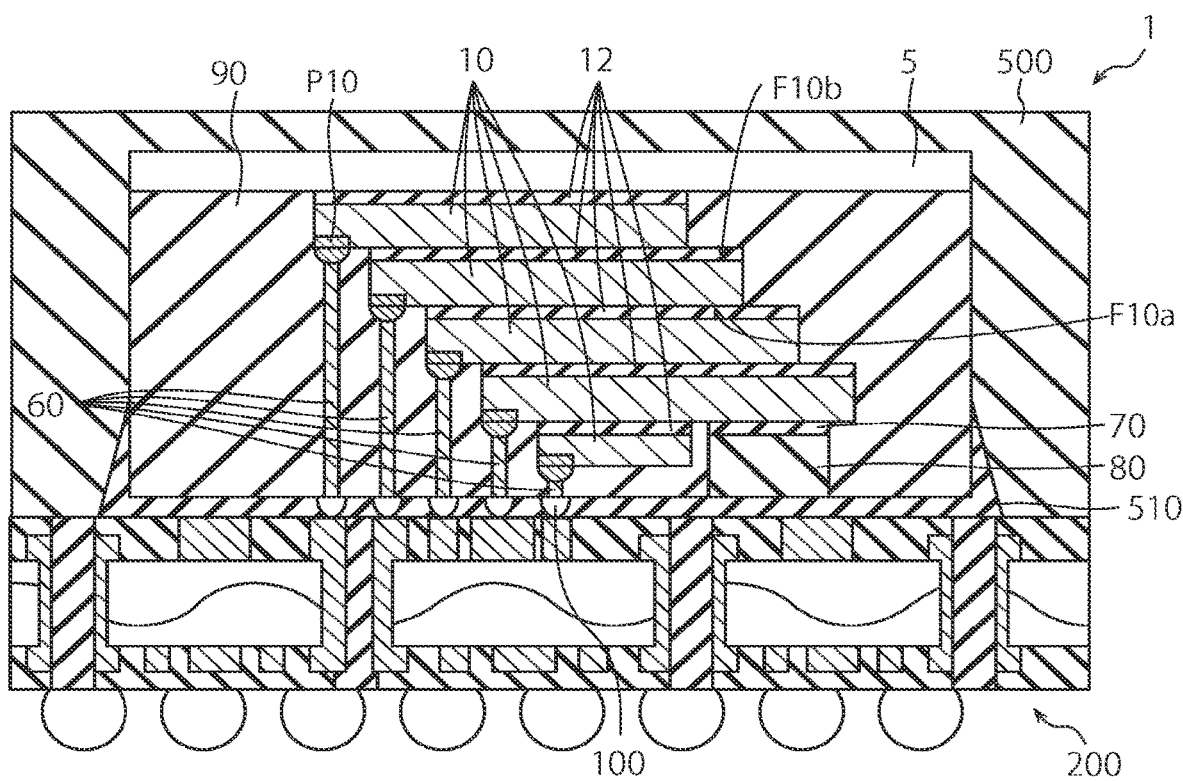
FIGS. 49 to 52 are sectional views illustrating a configuration example of the semiconductor device according to a twenty-second embodiment.
Figure 50:
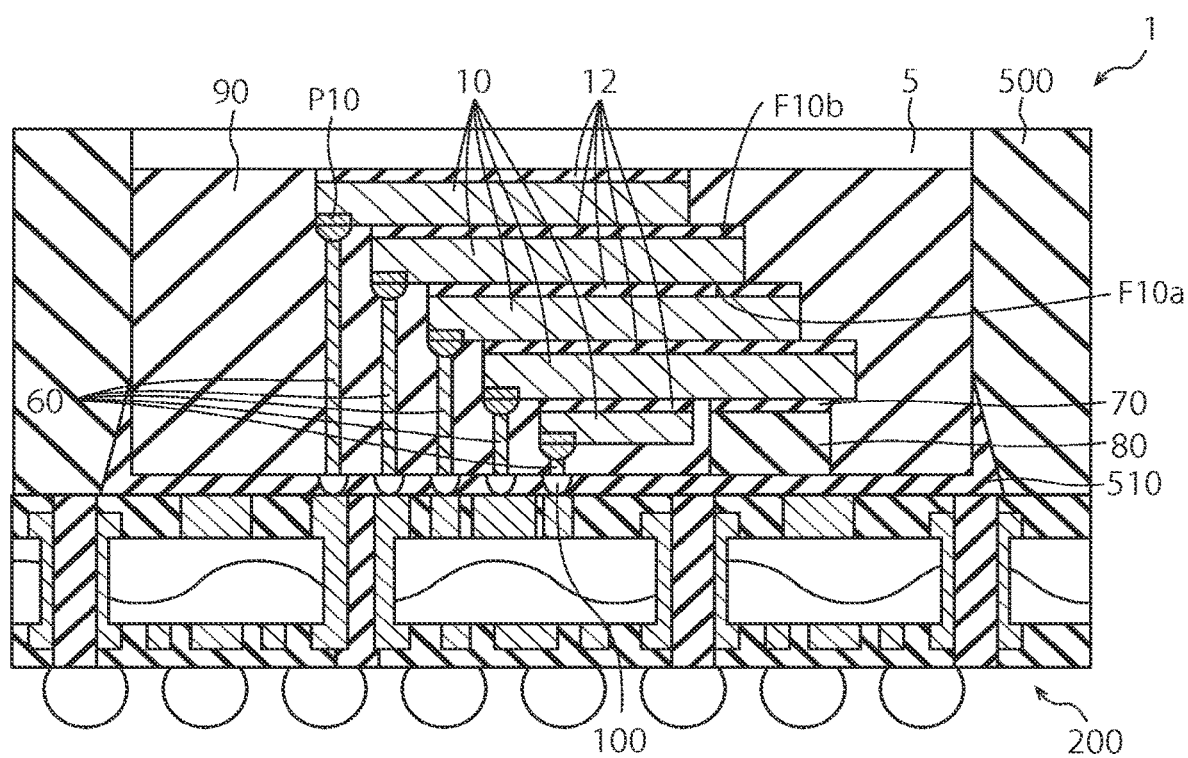

While the insulant 500 can be provided over the support substrate 5 to cover the support substrate 5 as illustrated in FIG. 49, the insulant 500 may be provided to expose the upper surface of the support substrate 5 as illustrated in FIG. 50. In this case, the heat dissipation of the support substrate 5 can be increased.

Figure 51:
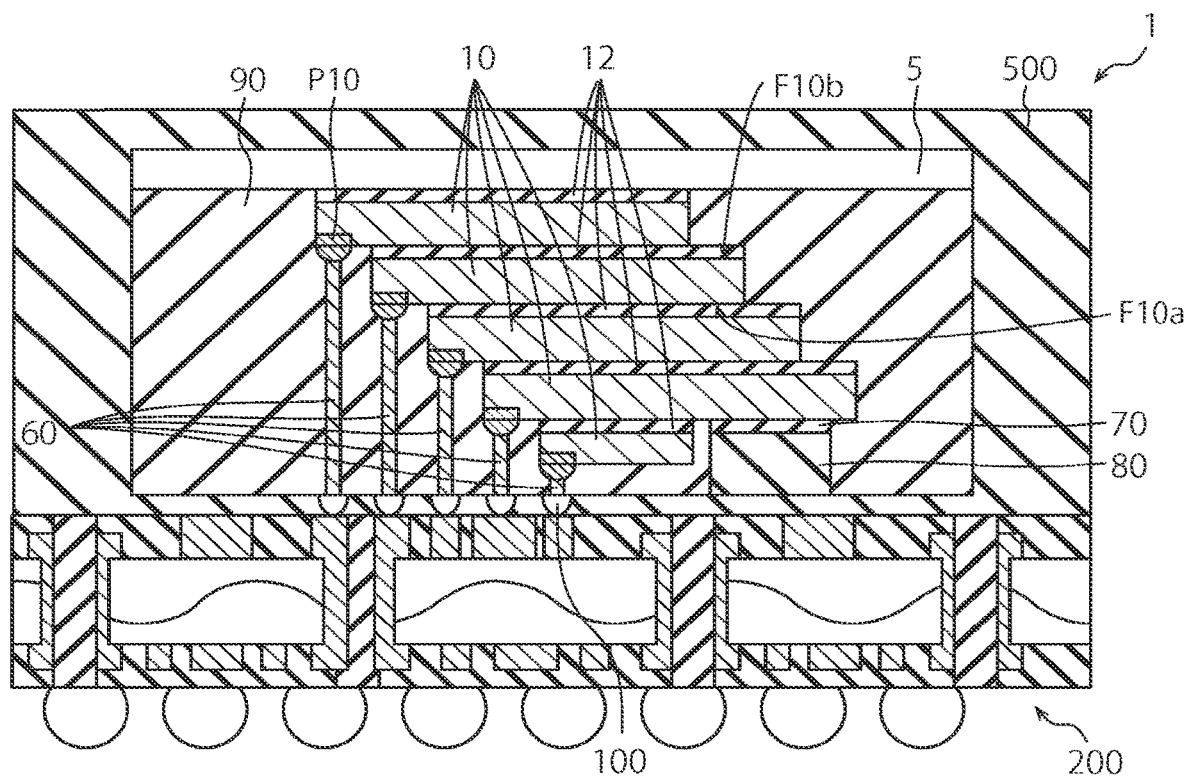
Figure 52:
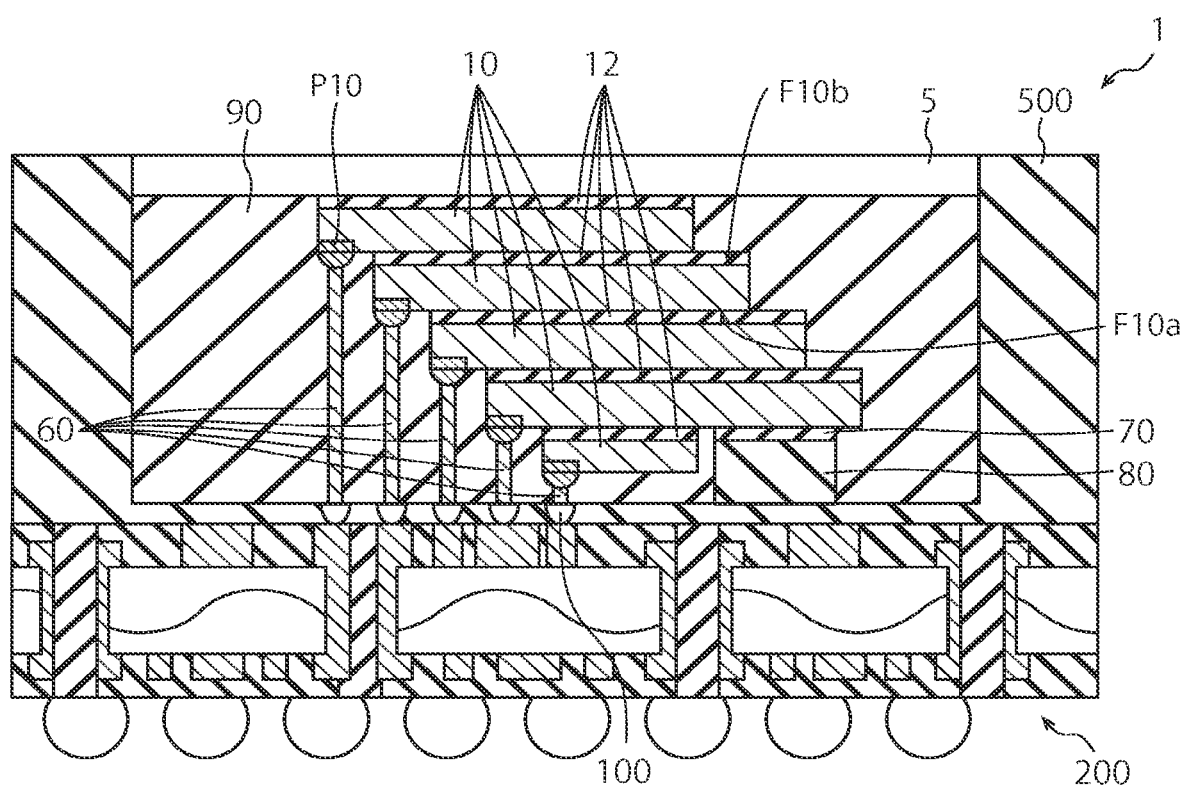

Only either the insulant 500 or the underfill 510 may be provided. For example, the insulant 500 may cover the semiconductor device 1 with the underfill 510 omitted as illustrated in FIGS. 51 and 52. In this case, the insulant 500 instead of the underfill is embedded between the semiconductor device 1 and the wiring board 200 to cover and protect the metallic bumps 100. The twenty-second embodiment may be combined with any of the embodiments described above.

FIGS. 28 to 52 illustrate examples in which wires are used as the columnar electrodes 60. It is needless to mention that wires that directly connect chips to each other and the columnar electrodes 60 using wires may be present in a mixed manner as in a general product formed by the wire bonding method. Alternatively, wires that directly connect chips to each other, the columnar electrodes 60 using wires, and the columnar electrodes 60 to which the plating method or the like is applied may be present in a mixed manner.

Twenty-Third Embodiment

Figure 53:
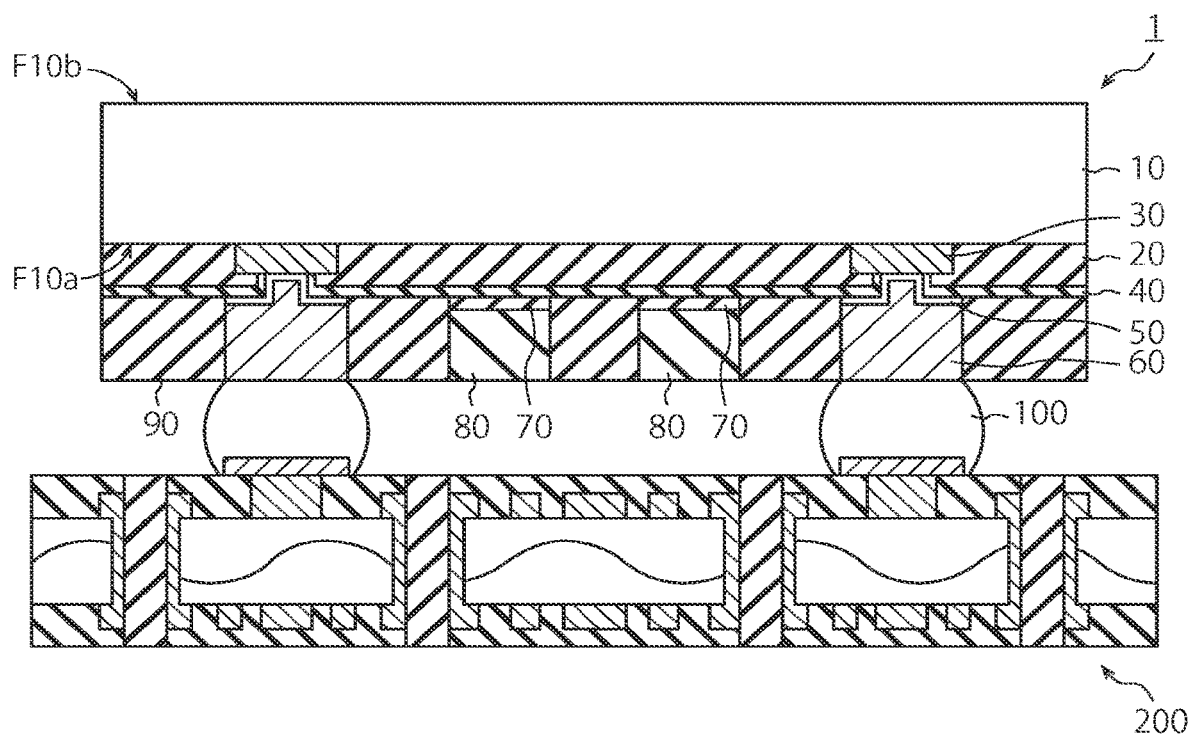
FIG. 53 is a sectional view illustrating a configuration example of the semiconductor device according to a twenty-third embodiment.

FIG. 53 is a sectional view illustrating a configuration example of the semiconductor device 1 according to a twenty-third embodiment. The twenty-third embodiment is different from the first embodiment in that a plurality of the dummy members 80 are arranged in one semiconductor chip 10. The rest of the configuration of the twenty-third embodiment can be identical to the corresponding configuration of the first embodiment. With arrangement of the dummy members 80, the dummy members 80 can further serve as stoppers and can also adjust warp of the semiconductor device 1. As a result, the reliability can be increased.

Twenty-Fourth Embodiment

Figure 54:
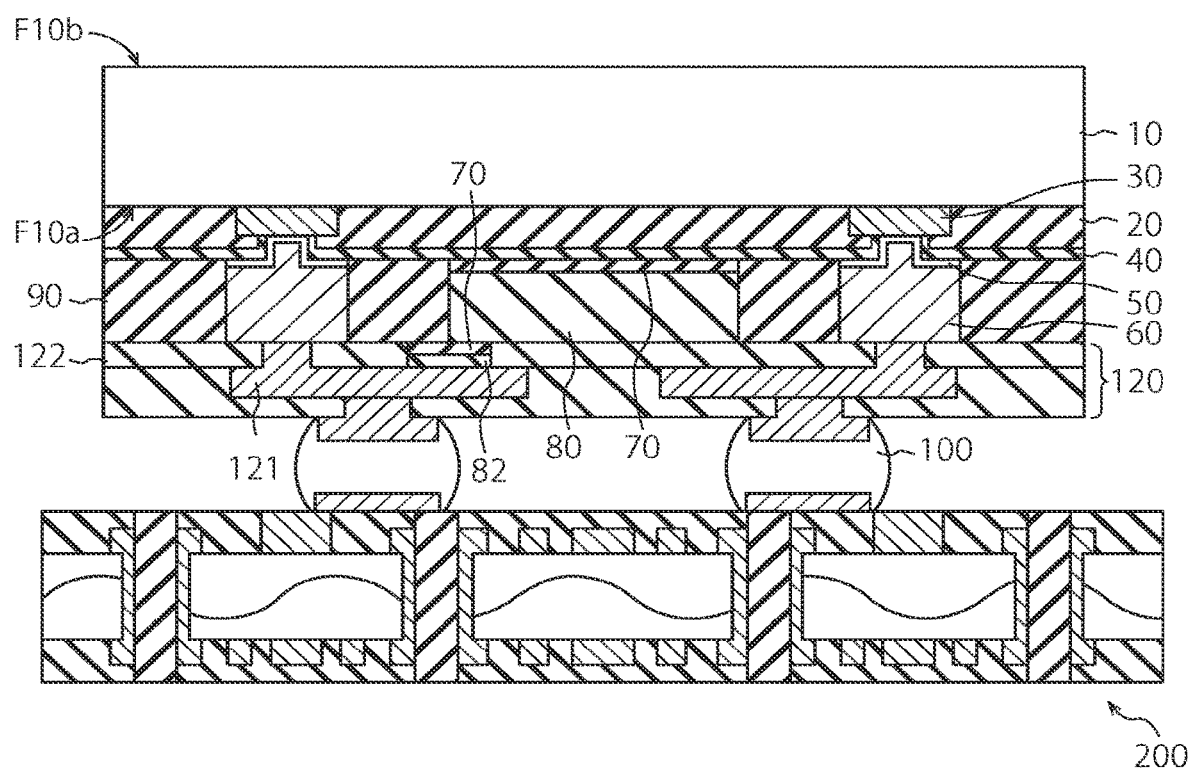
FIG. 54 is a sectional view illustrating a configuration example of the semiconductor device according to a twenty-fourth embodiment.

FIG. 54 is a sectional view illustrating a configuration example of the semiconductor device 1 according to a twenty-fourth embodiment. The twenty-fourth embodiment is different from the sixth embodiment in further including a dummy member 80 placed in the redistribution layer 120. The rest of the configuration of the twenty-fourth embodiment can be identical to the corresponding configuration of the sixth embodiment. With the dummy member 80 arranged in the redistribution layer 120 in addition to the dummy member 80, warp of the semiconductor device 1 can be adjusted. As a result, the reliability can be increased. A plurality of the dummy members 80 may be provided between a plurality of interconnection layers in the redistribution layer 120, respectively. This enables warp of the semiconductor device 1 to be further adjusted.

Twenty-Fifth Embodiment

Figure 55:
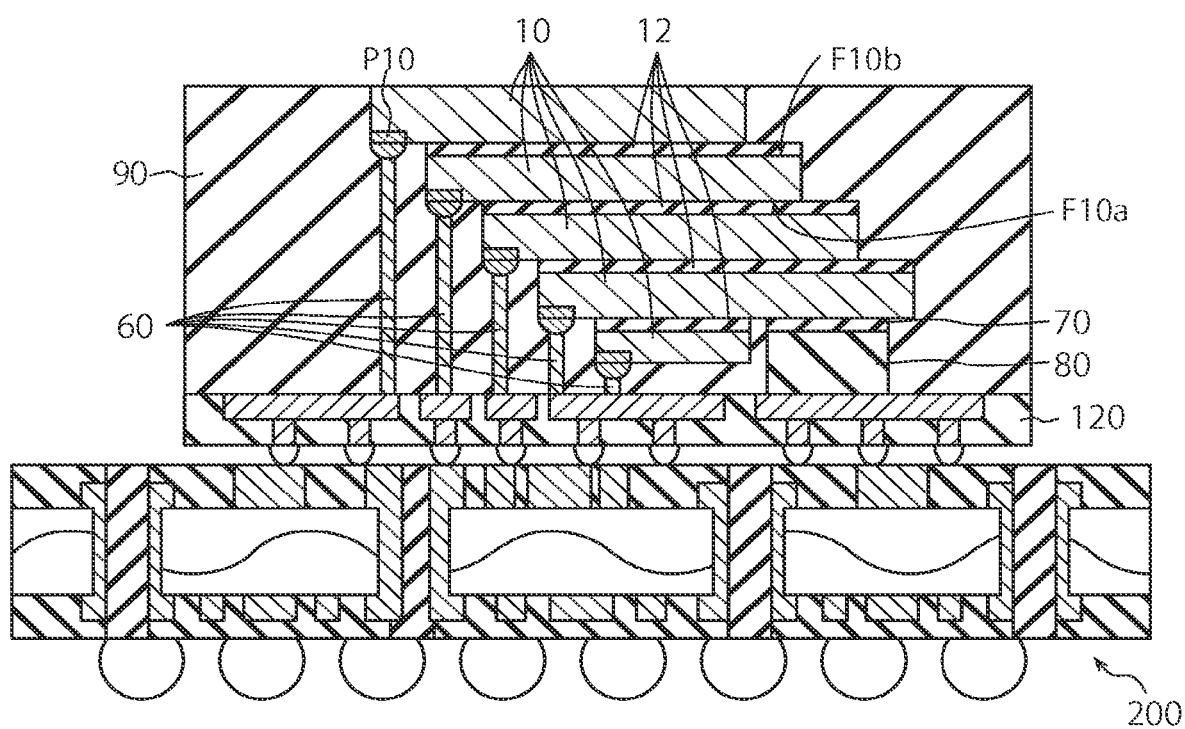
FIG. 55 is a sectional view illustrating a configuration example of the semiconductor device according to a twenty-fifth embodiment.

FIG. 55 is a sectional view illustrating a configuration example of the semiconductor device 1 according to a twenty-fifth embodiment. The twenty-fifth embodiment is different from the eleventh embodiment in including the redistribution layer 120 on the columnar electrodes 60 of the semiconductor device 1. The redistribution layer 120 is formed on the third insulating film 90 and the columnar electrodes 60 after the third insulating film 90 is polished. The metallic bumps 100 are formed on the redistribution layer 120. With provision of the redistribution layer 120, the pitch between the metallic bumps 100 can be widened even when the pitch between the columnar electrodes 60 is narrow. Further, the redistribution layer 120 enables the semiconductor chips 10 to be electrically connected to each other via interconnections in the redistribution layer 120. The dummy member 80 may be formed in the redistribution layer 120. A plurality of the redistribution layers 120 may be provided and the dummy members 80 may be respectively provided in the redistribution layers 120.

Twenty-Sixth Embodiment

Figure 56:
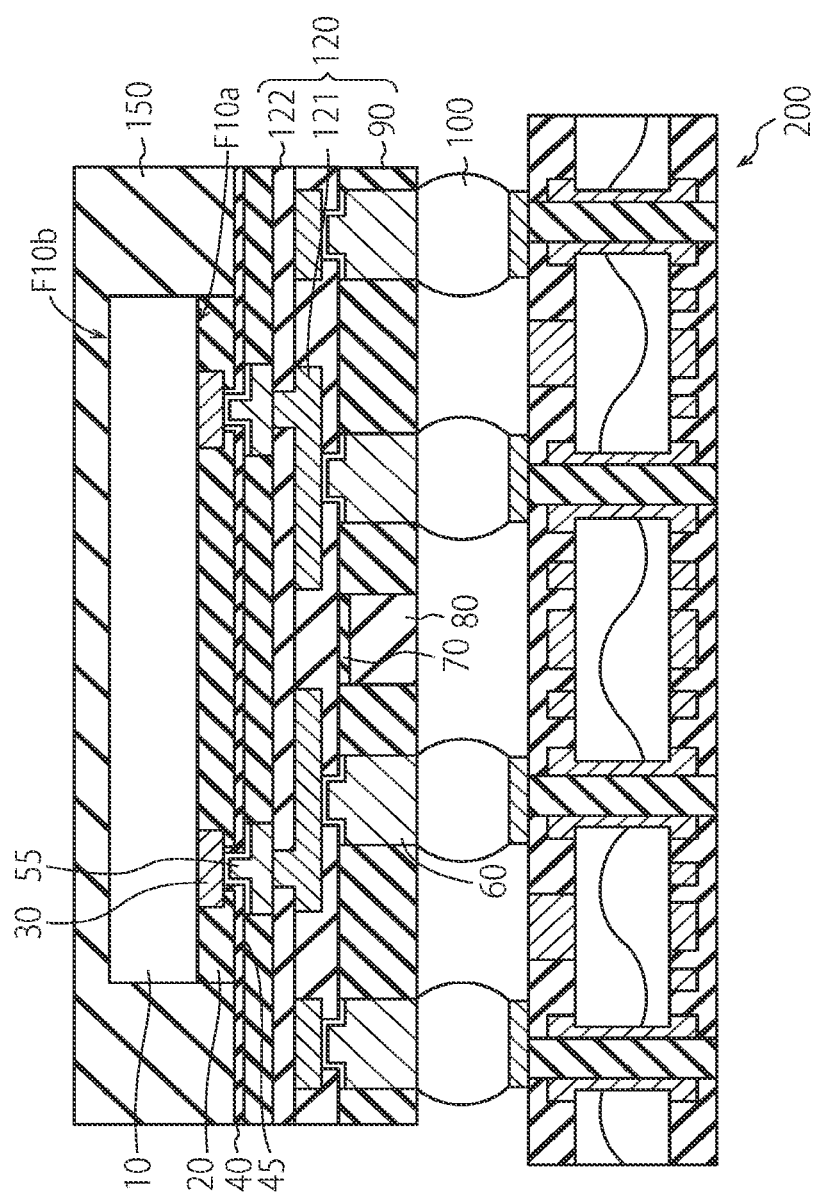
FIG. 56 is a sectional view illustrating a configuration example of the semiconductor device according to a twenty-sixth embodiment.

FIG. 56 is a sectional view illustrating a configuration example of the semiconductor device 1 according to a twenty-sixth embodiment. The present embodiment is an example in which the semiconductor device 1 is applied to a so-called fan-out wafer level CSP (Chip Size Package). Processes of the fan-out wafer-level CSP are broadly divided into RDL Last and RDL First. The RDL Last is a method of forming the redistribution layer 120 after a semiconductor chip is covered with a fourth insulating film (an insulant) 150, and the RDL First is a method of forming the redistribution layer 120 before a semiconductor chip is covered with the fourth insulating film 150. An epoxy-based resin, a phenol-based resin, a polyimide-based resin, a polyamide-based resin, an acrylic-based resin, a PBO-based resin, a silicon-based resin, or a benzocyclobutene-based resin, or a mixed material or a composite material thereof is used as the fourth insulating film 150. Examples of the epoxy resin are not particularly limited and are bisphenol-based epoxy resins such as a bisphenol A type, a bisphenol F type, a bisphenol AD type, and a bisphenol S type, novolak-based epoxy resins such as a phenol novolak type and a cresol novolak type, aromatic epoxy resins such as a resorcinol-based epoxy resin and trisphenol methane triglycidyl ether, a naphthalene-based epoxy resin, a fluoren-based epoxy resin, a dicyclopentadiene-based epoxy resin, a polyether-modified epoxy resin, a benzophenone-based epoxy resin, an aniline-based epoxy resin, an NBR-modified epoxy resin, and a CTBN-modified epoxy resin, and hydrogenated substances thereof. Among these, the naphthalene-based epoxy resin and the dicyclopentadiene-based epoxy resin are preferable because of a high adhesiveness with Si. The benzophenone-based epoxy resin is also preferable because it is likely to rapidly harden. These epoxy resins can be used alone, or two or more types thereof may be used in combination. A filler such as silica may be contained in the fourth insulating film 150.

FIG. 56 illustrates an example in which the dummy member 80 is formed in the redistribution layer 120 in the RDL Last. In the RDL Last method, the semiconductor chip 10 is mounted on a support substrate having a release layer formed thereon, and the semiconductor chip 10 is covered with the fourth insulating film 150. Subsequently, the support substrate is separated and the redistribution layer 120 is formed on an element face of the semiconductor chip 10. After the columnar electrodes 60 are formed, the third insulating film 90 is formed, and the third insulating film 90 is flattened by the mechanical polishing method, the CMP, or the like. In this case, the third insulating film 90 is polished until the columnar electrodes 60 are exposed and the dummy member 80 functions as a stopper at that time. There is the fourth insulating film 150 around the semiconductor chip 10 and the redistribution layer 120 is formed on the element face of the semiconductor chip 10. The redistribution layer 120 is located on the first face F10a of the semiconductor chip 10 and on the fourth insulating film 150 flush with the first face F10a. The dummy member 80 is formed in the redistribution layer 120 and the metallic bumps 100 are formed on the redistribution layer 120. The metallic bumps 100 are electrically connected to the wiring board 200. With provision of the dummy member 80 in the redistribution layer 120 including the third insulating film of the fan-out wafer-level CSP, warp of the semiconductor device 1 can be corrected and the reliability can be increased.

Twenty-Seventh Embodiment

Figure 57:
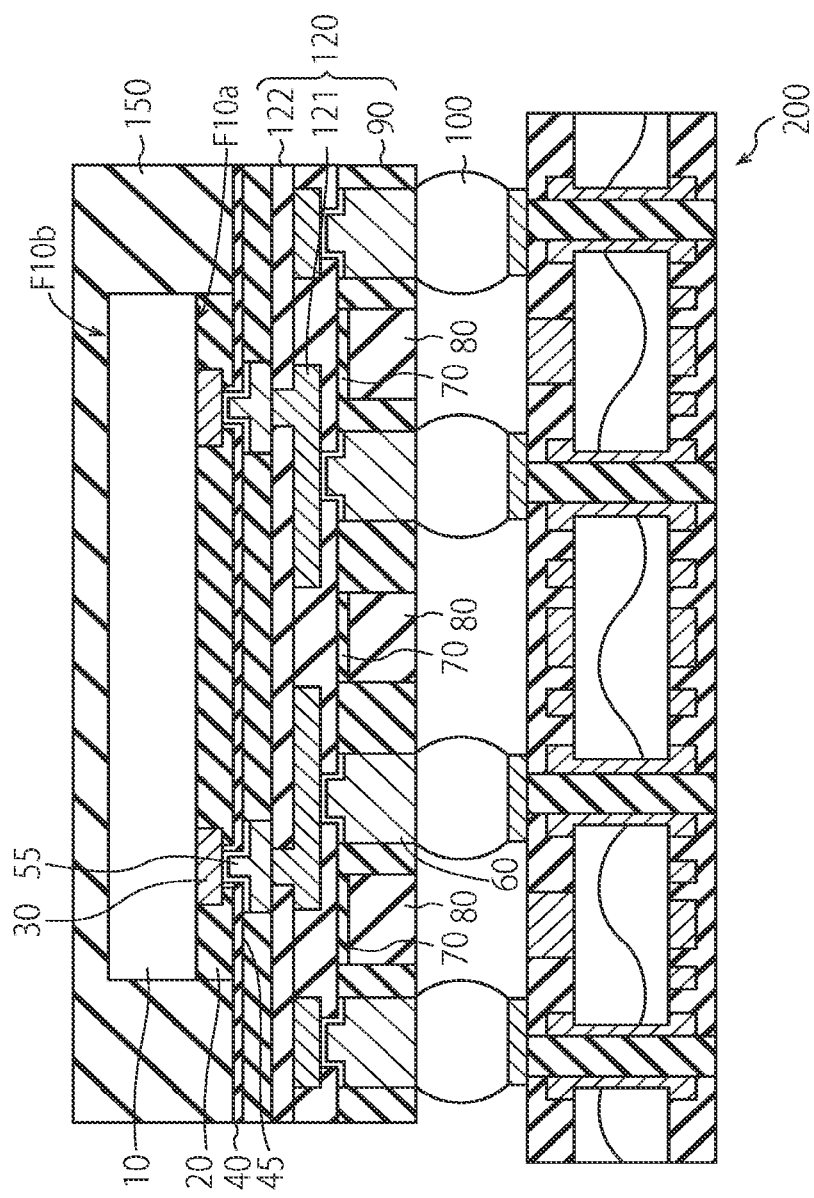
FIG. 57 is a sectional view illustrating a configuration example of the semiconductor device according to a twenty-seventh embodiment.

FIG. 57 is a sectional view illustrating a configuration example of the semiconductor device 1 according to a twenty-seventh embodiment. A plurality of the dummy members 80 are provided in the third insulating film 90 in the embodiment illustrated in FIG. 56. The rest of the configuration of the twenty-seventh embodiment can be identical to the corresponding configuration of the twenty-sixth embodiment. With an increased number of the dummy members 80, warp of the semiconductor device 1 can be adjusted and the reliability can be further increased. The dummy members 80 may be formed in a plurality of the redistribution layers 120, respectively. The twenty-seventh embodiment can be combined with other embodiments.

Twenty-Eighth Embodiment

Figure 58:
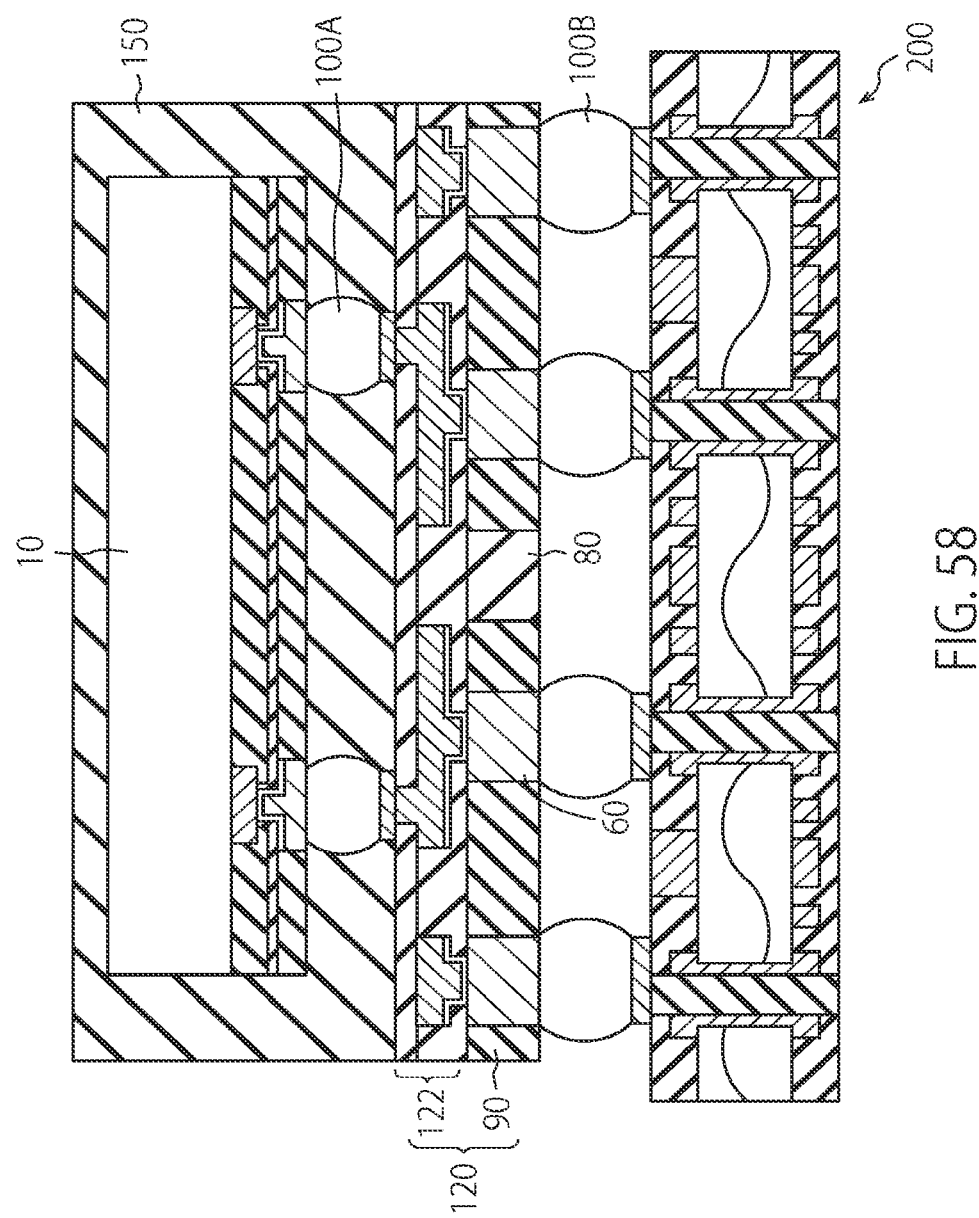
FIG. 58 is a sectional view illustrating a configuration example of the semiconductor device according to a twenty-eighth embodiment.

FIG. 58 is a sectional view illustrating a configuration example of the semiconductor device 1 according to a twenty-eighth embodiment. The present embodiment is an example in which the semiconductor device 1 is applied to a so-called fan-out wafer-level CSP. FIG. 58 illustrates an example in which the dummy member 80 is formed in the third insulating film 90 in the RDL First. In the RDL First method, a release layer is formed on a support substrate and the columnar electrodes 60 are formed. After the dummy member 80 is mounted on the release layer, the third insulating film 90 is formed to cover the columnar electrodes 60 and the dummy member 80 and is flattened by the mechanical polishing method, the CMP, or the like. In this case, the third insulating film 90 is polished until the columnar electrodes 60 are exposed, and the dummy member 80 functions as a stopper at that time. There is further the redistribution layer 120 on the dummy member 80 and the fourth insulating film 150 is located around the semiconductor chip 10. The semiconductor chip 10 has metallic bumps 100A and is flip-chip bonded to the redistribution layer 120. The dummy member 80 is formed in the third insulating film 90 and metallic bumps 100b are formed on the columnar electrodes 60. The metallic bumps 100B are electrically connected to the wiring board 200. With provision of the dummy member 80 in the redistribution layer 120 including the third insulating film 90 of the fan-out wafer-level CSP, warp of the semiconductor device 1 can be corrected and the reliability can be enhanced. After the redistribution layer is separated from the support substrate, the third insulating film 90 is polished to expose the columnar electrodes 60. Since polishing is performed from both the upper and lower sides, the dummy member 80 serves as a stopper of the polishing from the both sides.

Twenty-Ninth Embodiment

Figure 59:
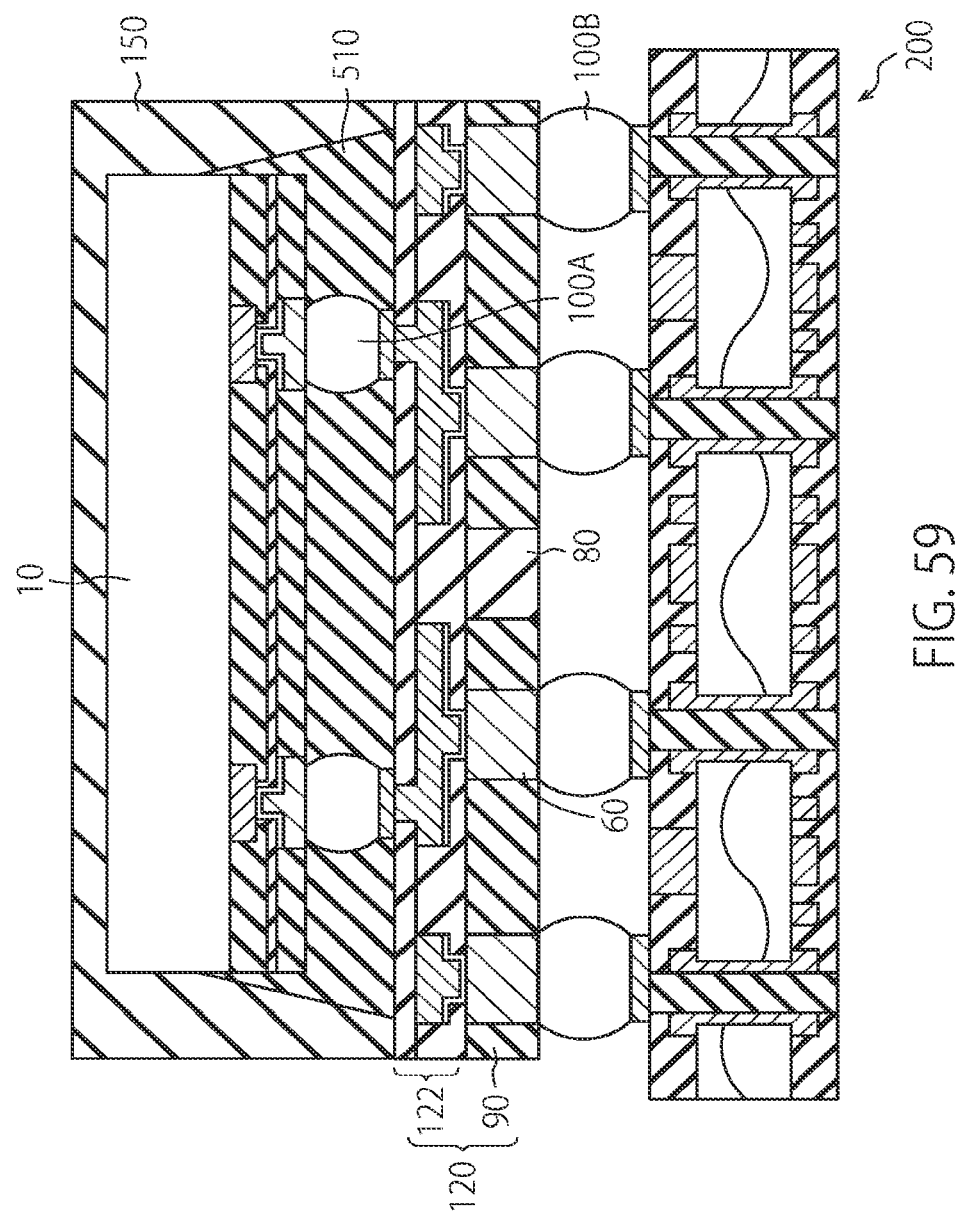
FIG. 59 is a sectional view illustrating a configuration example of the semiconductor device according to a twenty-ninth embodiment.

FIG. 59 is a sectional view illustrating a configuration example of the semiconductor device 1 according to a twenty-ninth embodiment. The twenty-ninth embodiment is different from the twenty-eighth embodiment in including the underfill 510 between the semiconductor chip 10 and the redistribution layer 120. The underfill 510 covers around the metallic bumps 100A located between the semiconductor chip 10 and the redistribution layer 120 for protection. Accordingly, reliability of the connection portion between the semiconductor chip 10 and the redistribution layer 120 is enhanced.

Thirtieth Embodiment

Figure 60A:
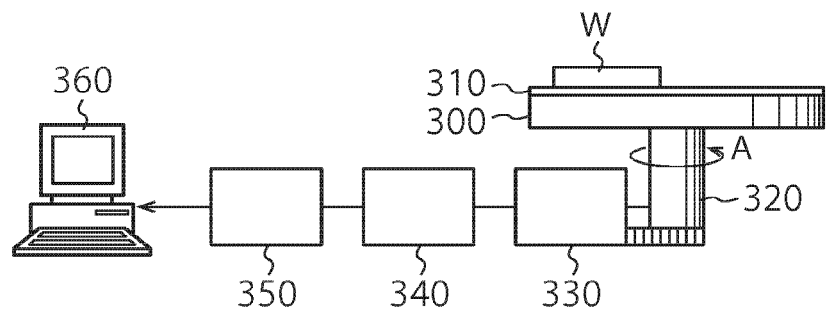
FIGS. 60A, 60B, and 60D are diagrams illustrating configuration examples of a polishing apparatus according to a thirtieth embodiment.
Figure 60B:
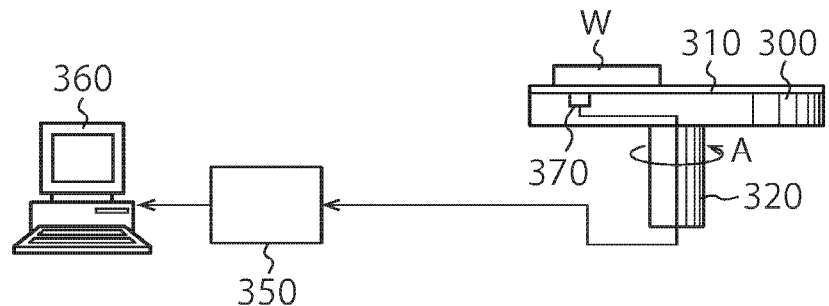
Figure 60C:
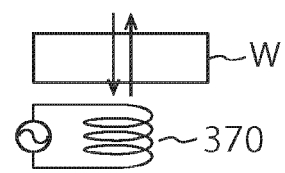
FIG. 60C is a conceptual diagram illustrating a schematic configuration of the eddy current sensor.
Figure 60D:
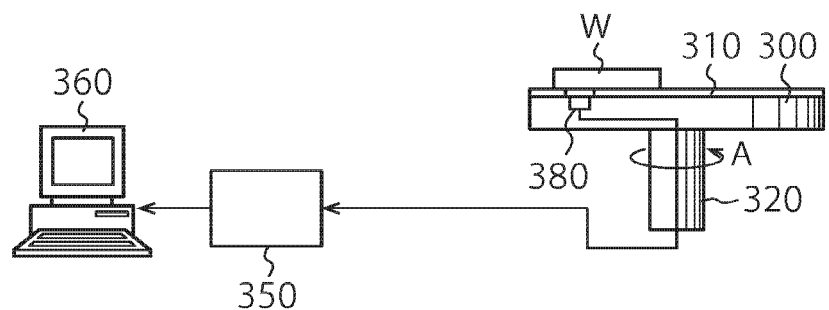

FIGS. 60A, 60B, and 60D are diagrams illustrating configuration examples of a polishing apparatus according to a thirtieth embodiment.

The polishing apparatus illustrated in FIG. 60A includes a turntable 300, a polishing pad 310, a rotation shaft 320, a motor 330, a current sensor 340, a signal converter 350, and a computing part 360.

The turntable 300 is provided rotatably and has the polishing pad 310 mounted on the surface.

The polishing pad 310 is located on the turntable 300 and polishes a semiconductor substrate W.

The rotation shaft 320 is fixed to the turntable 300 and transmits power from the motor 330 to the turntable 300 to rotate the turntable 300.

The motor 300 receives power from a power source (not illustrated) to rotate the rotation shaft 320 as indicated by an arrow A.

The current sensor 340 measures a current consumed by the motor 330.

The signal converter 350 converts a consumed current value of the motor 330 measured by the current sensor 340, and transmits the converted value to the computing part 360.

The computing part 360 is, for example, a PC (Personal Computer) and detects an end point of polishing processing of the semiconductor substrate W based on a current consumed by the motor 330. More specifically, the consumed power of the motor 330 changes according to friction between the semiconductor substrate W and the polishing pad 310. The friction between the semiconductor substrate W and the polishing pad 310 changes according to changes in the contact area before and after flattening of the semiconductor substrate W or changes in the type of a film being polishing. Such changes in the friction can be detected according to the consumed power of the motor 330. This method of detecting an end point of polishing is referred to also as TCM (Torque Current Monitor).

The polishing apparatus illustrated in FIG. 60B is different from that in FIG. 60A in further including an eddy current sensor 370. The rest of the configuration of the polishing apparatus illustrated in FIG. 60B can be same as the corresponding configuration of the polishing apparatus in FIG. 60A. The current monitor 340 in FIG. 60A may be omitted.

The eddy current sensor 370 is configured of a coil as illustrated in FIG. 60C and detects an induced current (an eddy current) generated on the semiconductor substrate W. The computing part 360 computes an end point of the polishing processing based on changes of the frequency, the voltage, or the like of impedance due to the eddy current. FIG. 60C is a conceptual diagram illustrating a schematic configuration of the eddy current sensor 370.

This polishing end-point detecting method is also referred to as an ECM (Eddy Current Monitor).

The polishing apparatus illustrated in FIG. 60D is different from that in FIG. 60A in further including a reflected light sensor 380. The rest of the configuration of the polishing apparatus illustrated in FIG. 60D can be same as the corresponding configuration of the polishing apparatus in FIG. 60A. The current monitor 340 in FIG. 60A may be omitted.

The reflected light sensor 380 irradiates a semiconductor substrate W with light and detects reflected light from the semiconductor substrate W to obtain the reflectance as illustrated in FIG. 60D. The computing part 360 detects an end point of the polishing processing based on changes in the reflectance.

This polishing end-point detecting method is also referred to as OTM (Optical Thickness Monitor).

The end-point detecting method based on changes in the polishing resistance explained with reference to FIG. 60A corresponds to the detecting method of the CMP used in the embodiments explained above.

In a case where the optical end-point detecting method based on changes in the reflectance explained with reference to FIG. 60D is used, it suffices that the reflectance or transmittance of the dummy members 80 or 81 is different from that of the third insulating film 90. Since the third insulating film 90 is generally dark, the reflectance of the dummy members 80 or 81 can be set higher relative to the measured wavelength. While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a semiconductor chip having a first face and a second face on an opposite side to the first face, and including semiconductor elements on the first face;
   columnar electrodes provided above the first face, and electrically connected to any of the semiconductor elements;
   a first member located. around the columnar electrodes above the first face;
   a first resin layer provided between the first member and the first face and directly connected with a face of the first member which is opposite to the first face; and
   a second resin layer covering the columnar electrodes and the first member, wherein
   the first member is harder than the columnar electrodes and the second resin layer, and
   the first member and the columnar electrodes are exposed from a surface of the second resin layer,
   a height of a lower end of the first member is higher than a height of lower ends of the columnar electrodes,
   a thickness of the first member is thinner than a thickness of the second resin layer,
   the first resin layer and the second resin layer contact directly,
   surfaces of the first member, the columnar electrodes and the second resin layer are substantially flush with each other, and
   a height of the lower end of the first resin layer is higher than a height of the lower ends of the columnar electrodes.

2. The device of claim 1, wherein
   the first member comprises a third face exposed from the second resin layer, a fourth face corresponding to the first face of the semiconductor chip, and a side surface between the third face and the fourth face, and
   the side surface is inclined from a perpendicular direction with respect to the first face or has a stepped portion.

3. The device of claim 1, wherein the first member is a stacked body configured by stacking a plurality of second members having surface areas different from each other as viewed from the first face.

4. The device of claim 1, wherein any of silicon, glass, alumina, SiC, AlN, ceramics, and a metal is used as the first member.

5. The device of claim 1, further comprising metallic bumps respectively provided on the columnar electrodes.

6. The device of claim 5, wherein the first member is a conductive body and is electrically connected to any of the semiconductor elements.

7. The device of claim 1, further comprising an interconnection layer located on the columnar electrodes.

8. The device of claim 1, further comprising a metallic film between electrode pads of the semiconductor chip and the columnar electrodes, wherein
   an area of each of the columnar electrodes exposed from the second resin layer is larger than a contact area of the columnar electrode to an associated one of the electrode pads of the semiconductor chip.

9. The device of claim 1, wherein an area of each of the columnar electrodes exposed from the second resin layer is smaller than a contact area of the columnar electrode to the semiconductor chip.

10. The device of claim 1, wherein the columnar electrodes include a first columnar electrode in which an area exposed from the second resin layer is larger than a contact area of the columnar electrode to the semiconductor chip, and a second columnar electrode in which an area exposed from the second resin layer is smaller than a contact area of the columnar electrode to the semiconductor chip.

11. The device of claim 1, wherein
    the second resin layer embeds a plurality of the semiconductor chips stacked, and
    the first member is placed on any of the semiconductor chips.

12. The device of claim 11, wherein
    the semiconductor chips are a plurality of memory chips and a controller chip for the memory chips, and
    the first member and the controller chip are located on a stacked body of the memory chips.

13. The device of claim 1, wherein any of a simple substance of Cu, Ni, W, Au, Ag, Pd, Sn, Bi, Zn, Cr, Al, or the like, a composite membrane including two or more thereof, and an alloy including two or more thereof is used as the columnar electrodes.

14. The device of claim 1, further comprising a support part provided on the second face of the semiconductor chip.

15. The device of claim 1, further comprising an interconnection layer on the first face of the semiconductor chip, wherein
    the columnar electrodes and the first member are provided in the interconnection layer.

16. The device of claim 1, further comprising:
    a fourth insulating film covering the semiconductor chip; and
    an interconnection layer provided on the first face of the semiconductor chip and on a face of the fourth insulating film flush with the first face, wherein
    the columnar electrodes and the first member are provided in the interconnection layer.

17. The device of claim 1, wherein
    in a view from above of the first member, the first member overlaps on the first resin layer.

18. The device of claim 1, wherein
    in a view from above of the first member, the first member does not overlap on the second resin layer.

19. The device of claim 1, wherein
    the first member is insulated from the semiconductor chip.

20. The device of claim 1, wherein
    in a view from above of the first member, the first member does not overlap on the columnar electrodes.

* * * * *